(12) United States Patent
Nishizaka et al.

(10) Patent No.: US 7,624,870 B2
(45) Date of Patent: Dec. 1, 2009

(54) SINGLE THIN PLATE STORAGE CONTAINER AND SHOCK-ABSORBING SUPPORT MEMBERS USED THEREIN

(75) Inventors: Koichi Nishizaka, Kikuchi (JP); Yoichi Emura, Kikuchi (JP); Tadahiro Obayashi, Kikuchi (JP)

(73) Assignee: Miraial Co., Ltd. (JP)

( * ) Notice: Subject to any disclaimer, the term of this patent is extended or adjusted under 35 U.S.C. 154(b) by 370 days.

(21) Appl. No.: 11/431,578

(22) Filed: May 11, 2006

(65) Prior Publication Data

US 2006/0283772 A1 Dec. 21, 2006

(30) Foreign Application Priority Data

May 25, 2005 (JP) ............................. 2005-152828

(51) Int. Cl.
*B65D 85/48* (2006.01)
(52) U.S. Cl. ...................... 206/454; 206/303; 206/503
(58) Field of Classification Search .............. 206/308.1, 206/303, 710, 454, 455, 503
See application file for complete search history.

(56) References Cited

U.S. PATENT DOCUMENTS

| 3,615,006 | A | * | 10/1971 | Freed ........................ 206/454 |
| 4,208,117 | A | * | 6/1980 | Harvey et al. ............... 396/512 |
| 4,511,038 | A | | 4/1985 | Miller et al. ................. 206/454 |
| 4,748,530 | A | * | 5/1988 | Barnes ........................ 360/133 |
| 5,184,723 | A | * | 2/1993 | Karl et al. ................... 206/710 |
| 5,314,068 | A | * | 5/1994 | Nakazato et al. ............. 206/454 |
| 5,353,934 | A | * | 10/1994 | Yamauchi .................... 206/454 |
| 5,788,068 | A | * | 8/1998 | Fraser et al. ................. 206/310 |
| 6,193,068 | B1 | * | 2/2001 | Lewis et al. .................. 206/710 |
| 6,837,374 | B2 | * | 1/2005 | Nigg et al. ................... 206/454 |
| 2005/0183974 | A1 | * | 8/2005 | Wong et al. ................ 206/308.1 |
| 2005/0269241 | A1 | | 12/2005 | Brooks et al. ............... 206/710 |
| 2006/0000747 | A1 | * | 1/2006 | Wright et al. ............... 206/710 |

FOREIGN PATENT DOCUMENTS

| JP | 10-050815 | 2/1998 |
| WO | 92/21145 | 11/1992 |

OTHER PUBLICATIONS

EPO Search Report.

* cited by examiner

*Primary Examiner*—J. Gregory Pickett
*Assistant Examiner*—Jenine M Pagan
(74) *Attorney, Agent, or Firm*—Bacon & Thomas, PLLC

(57) ABSTRACT

A single thin plate storage container 1 includes a main body 2 for storing one thin wafer A4 inside and a lid attached to the main body 2. The single thin plate storage container 1 includes a bottom side support member 35 that is located on the main body 2 side and supports the lid 3 from the bottom side, and a front side support member 36 that is located on the lid 3 side and supports the thin wafer 4A from the upper front side. The bottom side support member 35 includes a center support part 37, an outer periphery support part 38, a peripheral edge support part 39, and a ring plate 40 for combining integrally the center support part 37 and the outer support part 38. The front side support member 36 includes a disc 43 for covering the thin wafer 4A from the upper side and abutting parts 44, 45 to sandwich the thin wafer 4A between the two abutting parts and the bottom side support member 35.

2 Claims, 23 Drawing Sheets

SINGLE THIN PLATE STORAGE CONTAINER AND SHOCK-ABSORBING SUPPORT MEMBERS USED THEREIN

CROSS-REFERENCE TO RELATED APPLICATION

This application claims, under 35 USC 119, priority of Japanese Application No. 2005-152828 filed May 25, 2005.

BACKGROUND OF THE INVENTION

1. Field of the Invention

The present invention relates to a single thin plate storage container that stores a thin plate such as a semiconductor wafer, a memory disc, and a liquid crystal glass substrate and is used for storage, transport and manufacturing process, etc., and shock-absorbing support members used therein.

2. Description of the Background Art

Single thin plate storage containers for storing a single thin plate such as a semiconductor wafer, for purpose of storage or transport, are generally known. One example of a single thin plate storage container is a robot package described in International Application Publication No. WO 92/21145. This robot package has a compartment for wafer storage. A wafer is inserted into the compartment for storage and transport.

There is also a single thin plate storage container composed of a shallow dish-shaped body and a lid.

However, with such a robot package as mentioned above, it is not easy to put a wafer in or take it out from the compartment, resulting in a limitation in workability.

Meanwhile, the single thin plate storage container composed of a shallow dish-shaped body and a lid makes it easier to put in and take out a wafer than the above mentioned robot package, but this container also requires the wafers to be taken out from above. In the case with a dish-shaped container, since the stored wafer is surrounded by the wall of the container, it is impossible to insert vacuum tweezers of a transfer apparatus in a lateral direction. This requires the wafer to be taken out from above, causing insufficient workability.

In addition, with a thinner and larger wafer, it is difficult to lift the wafer held only at its edge from the viewpoint of strength, which would also pose a problem of unsatisfactory workability.

Especially, for a single thin plate storage container handling an extremely thin silicon wafer, it is important to consider not only the manner of putting in and taking out a wafer but also the manner of holding the wafer in the single thin plate storage container. That is, the silicon wafer is extremely thin as 25 to 400 μm as and thus can be easily bent like paper due to its lack of strength. Thus, the silicon wafer would be largely bent when being simply held at its edge, which leads to such troubles as breakage of the silicon wafer and damage to a microcircuit formed on the silicon wafer, etc.

In general, such an extremely thin silicon wafer is handled with its both sides covered with a protective film. The protective film reinforces the wafer and also makes it easy to handle. In this case as well, however, the silicon wafer will be bent heavily when being held at its edge, which may cause damage to a circuit formed on the silicon wafer surface, etc.

SUMMARY OF THE INVENTION

The present invention has been devised in view of the above described points and aims to provide a single thin plate storage container that allows such an extremely thin silicon wafer (thin wafer) as mentioned above to be securely held in an airtight manner with safety and reliability and to be easily put in and taken out thereto and therefrom.

The present invention has been made for solving the above mentioned issues, and is a single thin plate storage container comprising a main body for storing one ultra-thin plate that can be easily bent and a lid abutted to the main body, wherein the single thin plate storage container comprises a bottom side support member that is located on the main body side and supports the thin plate by a surface from the bottom side and a front side support member that is located on the lid side and supports the thin plate by a surface, line or point from the upper front side, and when the lid is closed, the bottom side support member abuts and supports the thin plate from the bottom side and the front side support member abuts and supports the thin plate from the upper front side.

The bottom side support member preferably includes a center support part for supporting a central part of the thin plate by the surface from the bottom side, an outer periphery support section for supporting an outer periphery of the thin plate by the surface from the bottom side, a peripheral edge support member for attaching a peripheral edge of the thin plate and supporting the thin plate radially from outside, and a ring board for combining integrally the center support part and the outer periphery support part. The front side support member preferably includes a abutting part that abuts a front side of the thin plate placed on the bottom side support member and supports the thin plate in such a manner as to sandwich the thin plate between the abutting part and the bottom side support member, and an elastic support part that is provided on the lid and supports the abutting part in an elastic manner. The abutting part is preferably composed of a peripheral edge abutting part provided as opposed to the outer periphery support part of the bottom side support member and supports the thin plate in such a manner to sandwich the thin plate between the peripheral edge abutting part and the outer periphery support section, and an center abutting part that is provided as opposed to the center support part of the bottom side support member and supports the thin plate in such a manner as to sandwich the thin plate between the center abutting part and the center support part.

As stated above, the bottom side support member and the front side support member support an extremely thin plate such as silicon wafer in such a manner to sandwich the thin plate between the two members from the upper and lower sides.

More specifically, the peripheral edge abutting part elastically supported by the elastic support part supports the thin plate in such a manner as to sandwich the thin plate between the peripheral edge abutting part and the outer periphery support part of the bottom side support member. In addition, the center abutting part elastically supported by the elastic support part supports the thin plate in such a manner as to sandwich the thin plate between the center abutting part and the center support part of the bottom side support member.

According to a thin plate storage container and shock-absorbing support members used therein of the present invention, the bottom side support member supports the thin plate from the bottom side and the front side support member supports the thin plate from the front side, which makes it possible to hold an extremely thin plate such as silicon wafer with safety and reliability in an airtight manner.

DESCRIPTION OF THE PREFERRED EMBODIMENTS

The embodiments of the present invention will be described below with reference to the accompanying drawings. A single thin plate storage container of the present invention is a container that stores a thin plate such as a large-diameter semiconductor wafer for the purposes of storage and transport, etc. The single thin plate storage container of the present invention is characterized by having shock-absorbing members attached inside. The description will be provided here with a semiconductor wafer as an example of thin plate. The wafer handled by the single thin plate storage container of the present invention is an extremely thin wafer with thickness of 25 to 400 µm. That is, this extremely thin wafer is low in strength to such an extent that, when being held at its edge, it is easily bent and thus cannot keep its own plane state. Accordingly, when being held at its edge, the thin wafer may become bent and damaged or a microcircuit formed on its surface may become broken. On this account, the single thin plate storage container of the present invention is configured to abut an upper front side and lower front side of an extremely thin wafer whose both upper and lower sides are covered by protective film, thereby supporting the thin wafer by surface. Hereinafter, the single thin plate storage container is firstly described and then the shock-absorbing members to be attached inside thereof are discussed. The single thin plate storage container described below is a single thin plate storage container for storing a wafer of normal thickness. The single thin plate storage container capable of storing an extremely thin wafer is configured by using a single thin plate storage container for storing a normal-thick wafer as it is.

Figure 2:
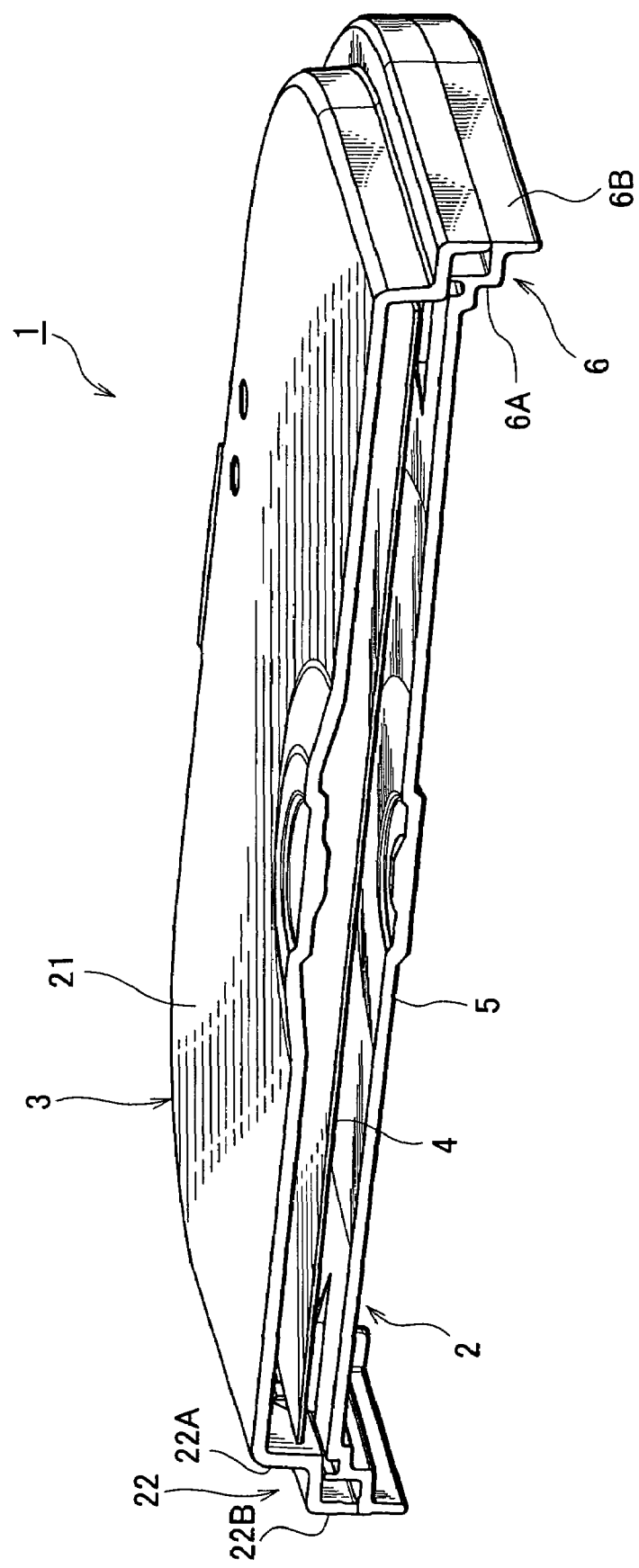
FIG. 2 is a perspective view showing the single thin plate storage container in cross section according to the embodiment of the present invention.
Figure 3:
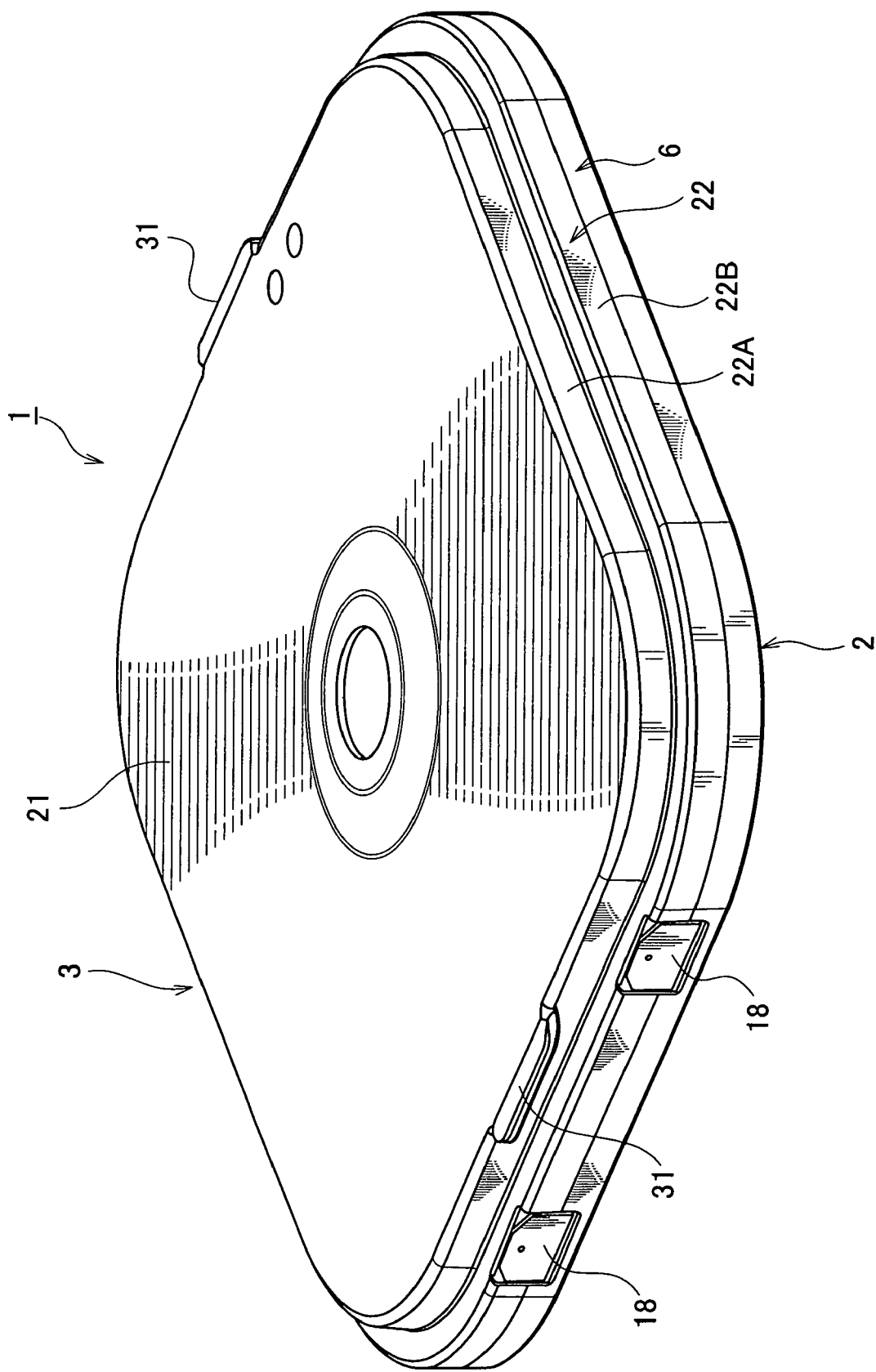
FIG. 3 is a perspective view showing, from a hook side, the single thin plate storage container according to the embodiments of the present invention.
Figure 4:
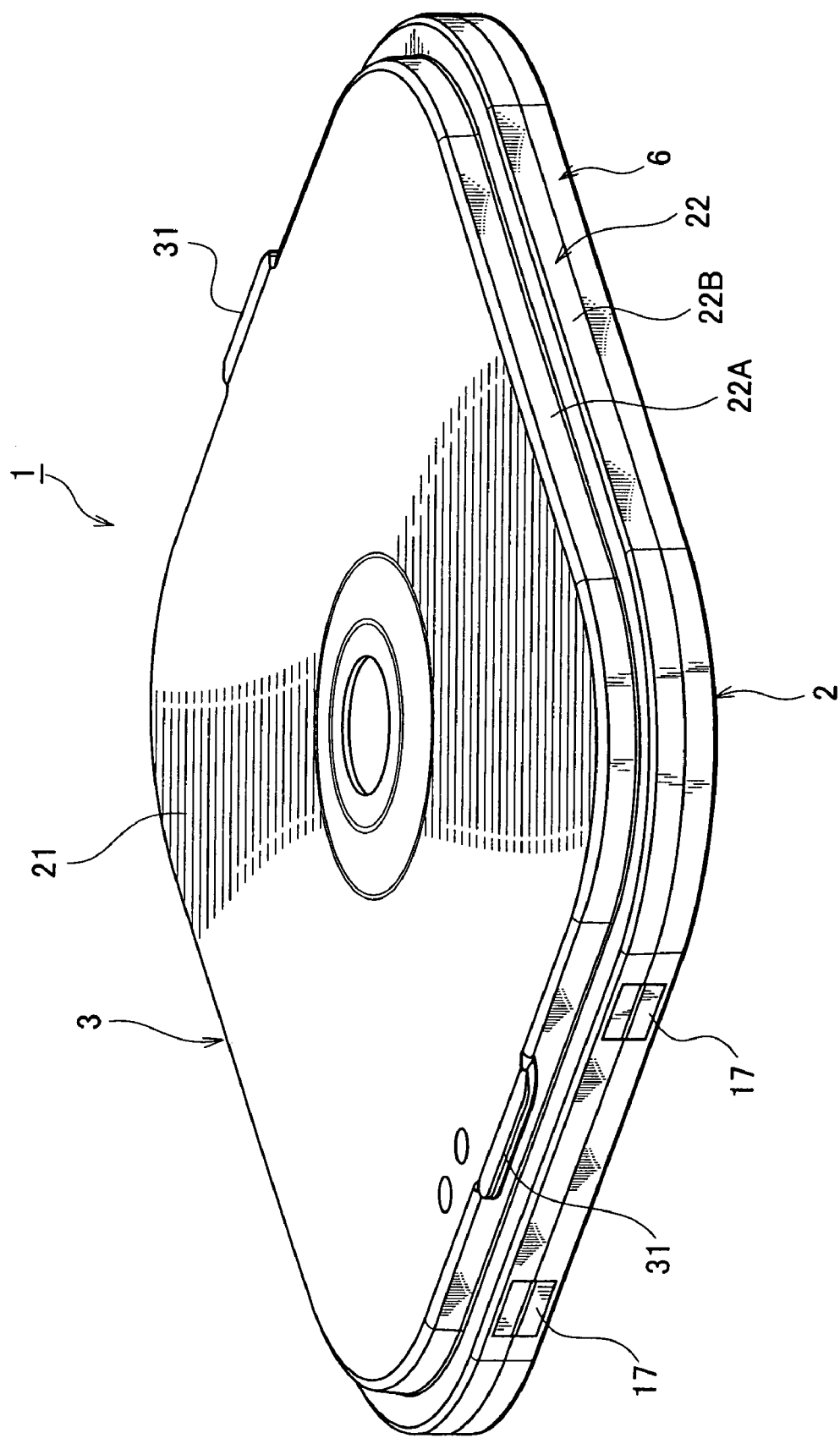
FIG. 4 is a perspective view showing, from a hinge side, the single thin plate storage container according to the embodiment of the present invention.
Figure 5:
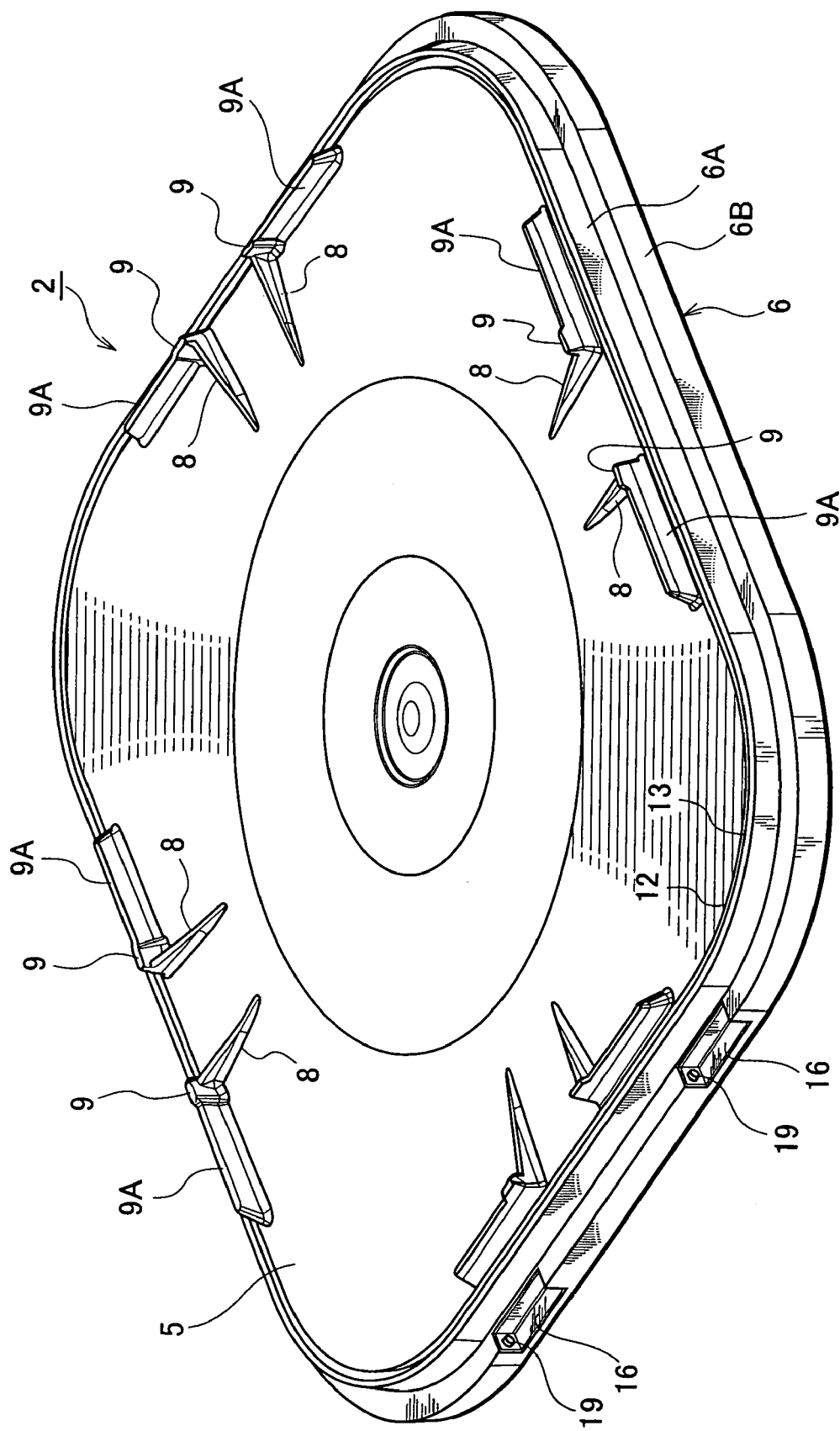
FIG. 5 is a perspective view showing a main body of the single thin plate storage container according to the embodiment of the present invention.
Figure 6:
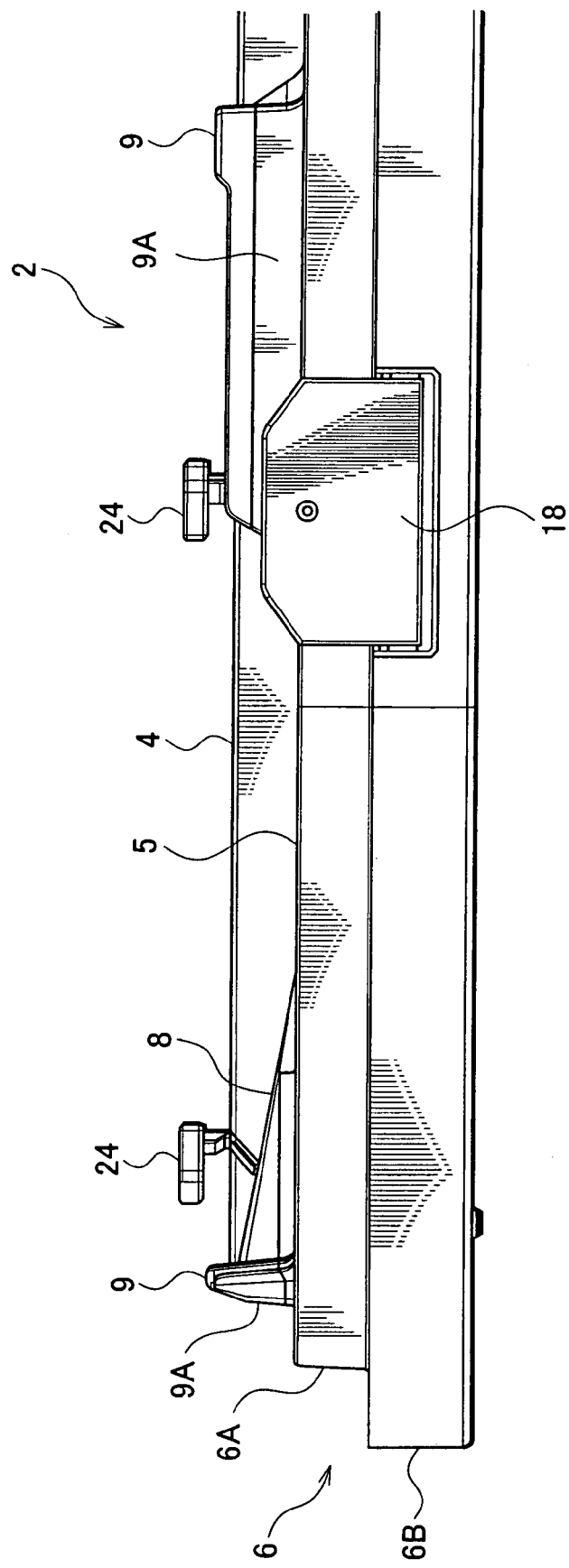
FIG. 6 is a front view showing a main portion of the main body of the single thin plate storage container according to the embodiment of the present invention.
Figure 7:
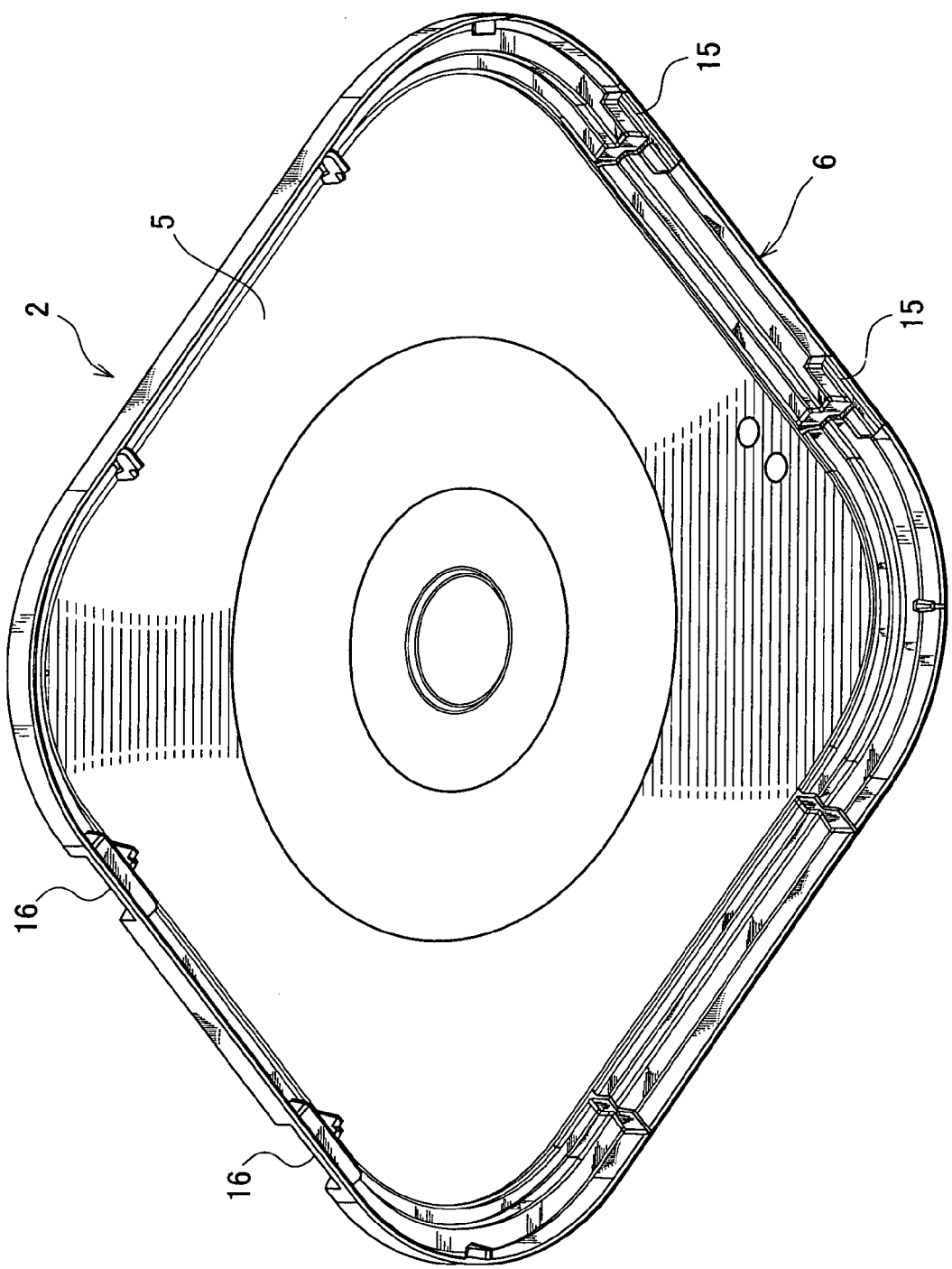
FIG. 7 is a perspective view showing, from a rear side, the main body of the single thin plate storage container according to the embodiment of the present invention.
Figure 8:
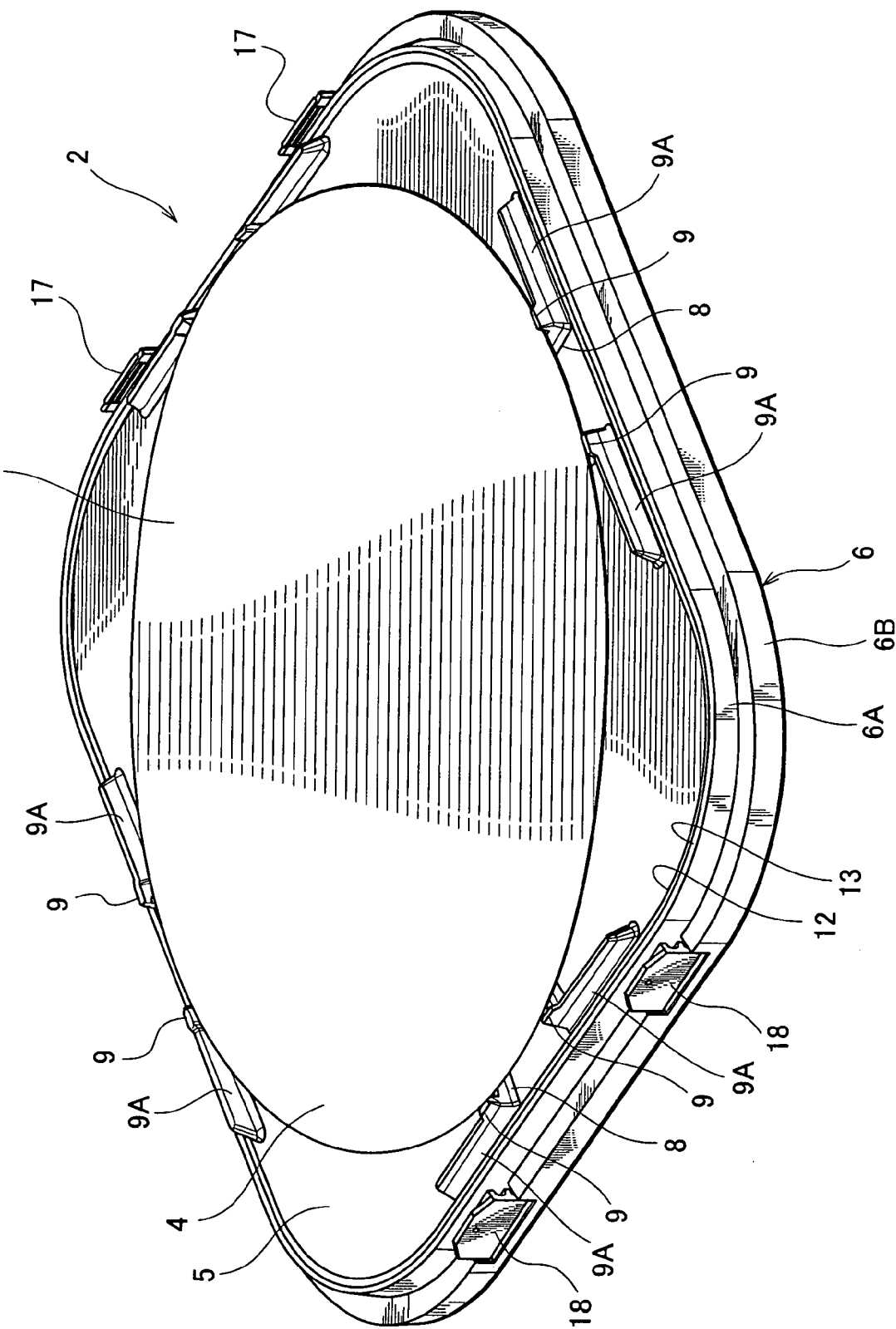
FIG. 8 is a perspective view showing a semiconductor wafer placed on the main body of the single thin plate storage container according to the embodiment of the present invention.

The single thin plate storage container 1 is mainly composed of a main body 2 and a lid 3 as shown in FIGS. 2 to 4, and is formed in the shape of a rectangle with four rounded corners. These main body 2 and lid 3 are made of a transparent non-electrostatic polymeric material. The employment of a non-electrostatic material prevents the absorption of dust, etc. In addition, using a transparent polymeric material makes it possible to see the state of the inside. Alternatively, either the main body 2 or the lid 3, not both of them, may be made of a non-electrostatic polymeric material. Moreover, only the lid 3, not both of them, may be made of a transparent polymeric material. The inside of the container can be seen through by making at least the lid 3 of a transparent polymeric material.

The main body 2 is a member for storing one semiconductor wafer 4 as a thin plate. As illustrated in FIGS. 5 to 10, the main body 2 is composed of a bottom plate 5 on which a bottom side support member 35 described later is placed and a peripheral wall 6 formed around the bottom plate 5.

The bottom plate 5 is a part for supporting the stored semiconductor wafer 4. The bottom plate 5 is raised up to a higher position than the peripheral wall 6. This aims to prevent the peripheral wall 6 from interfering with placing the semiconductor wafer 4 on the bottom plate 5 and taking out the semiconductor wafer 4 from the bottom plate 5. More specifically, this aims to, after the semiconductor wafer 4 supported by vacuum tweezers (not shown) etc. of a transfer apparatus is placed on the bottom plate 5, prevent the peripheral wall 6 from interfering with removing the vacuum tweezers etc. in a lateral direction from between the semiconductor 4 and the bottom plate 5, inserting the vacuum tweezers etc. into the lower side of the semiconductor wafer 4 from the side of the semiconductor wafer 4 placed on the bottom plate 5 and then lifting the vacuum tweezers etc.

A thin plate support convex strip 8 and an engagement piece 9 are provided on an upper side surface of the bottom plate 5. The thin plate support convex strip 8 is a member for supporting the semiconductor wafer 4 with a clearance left from the bottom plate 5. A plurality of (eight in this embodiment) thin plate support convex strips 8 are arranged on the peripheral edge of the bottom plate 5. Each of the thin plate support convex strips 8 is formed so as to extend radially toward the center from the peripheral edge of the bottom plate 5. The thin plate support convex strip 8 is formed in the shape of a wedge that is tapered toward the center from the peripheral edge of the bottom plate 5. The circumferential sectional shape of the thin plate support convex strip 8 is an approximate triangle that is tapered toward a portion of contact with the semiconductor wafer 4. By making its sectional shape an approximate triangle, the thin plate support convex strip 8 has point contact with the peripheral edge of the semiconductor wafer 4. This contact portion may have line or surface contact, instead of point contact. The thin plate support convex strip 8 must be formed in such a manner as to make contact by a possible smallest area, taking into consideration the shape of the thin plate support convex strip 8, the dimensions of the semiconductor wafer 4, and required degree of strength, etc.

This allows the thin plate support convex strip 8 to make uniform a force that acts on the semiconductor wafer 4, whereby a uniform holding power is applied to the semiconductor wafer 4. The reason for this is described below. Firstly, the thin plate support convex strip 8 has a function of placing the semiconductor wafer 4 on the center of the bottom plate 5 in combination with the retainer 24. That is, since the thin plate support convex strip 8 is formed wedge-wise and inclined, when the peripheral edge of the semiconductor wafer 4 is placed on the thin plate support convex strip 8, a force toward the center of the bottom plate 5 acts on the semiconductor wafer 4. In addition, the retainer 24 also exerts, on the semiconductor wafer 4, a force toward the center of the bottom plate 5. The retainer 24 presses the peripheral edge of the semiconductor wafer 4 downward and radially inward. The force of downward pressing acts on the peripheral edge of the semiconductor wafer 4 that is placed on a wedge-wise inclined portion of the thin plate support convex strip 8, which generates a force of pressing the semiconductor wafer 4 toward the center of the bottom plate 5. Furthermore, this force becomes weaker as the semiconductor wafer 4 moves away from the retainer 24, and becomes stronger as the semiconductor wafer 4 comes closer to the retainer 24. The same thing applies to the force of the retainer 24 itself to press the semiconductor wafer 4 radially inward. Meanwhile, the contact between the thin plate support convex strip 8 and the semiconductor wafer 4 takes a small area and has small friction resistance, and thus the semiconductor wafer 4 can be easily moved by the action of the above mentioned pressing forces. Accordingly, the semiconductor wafer 4 is moved to a position where the pressing forces are balanced, by a plurality of retainers 24 and a plurality of thin plate support convex strips 8 arranged around the semiconductor wafer 4.

As a result, the forces pressing the semiconductor wafer 4 are balanced at the center of the bottom plate 5 to which the semiconductor wafer 4 is moved by the above mentioned radially inward pressing forces of the retainer 24 and the thin plate support convex strip 8 and the radially inward pressing force generated through cooperation between the retainer 24 and the thin plate support convex strip 8, which makes uniform the force acting on the semiconductor wafer 4 and applies a uniform holding power to the semiconductor wafer 4. Consequently, in cooperation with the retainer 24, the thin plate support convex strip 8 performs the function of making uniform the forces acting on the semiconductor wafer 4, thereby applying a uniform holding power to the semiconductor wafer 4.

Two each thin plate support convex strips 8 are provided on each of sides of the rectangular bottom plate 5. A wider space than the vacuum tweezers etc. of a transfer apparatus is provided between the two adjacent thin plate support convex strips 8. This allows the vacuum tweezers of the transfer apparatus to put in and take out the semiconductor wafer 4 through the two adjacent thin plate support convex strips 8. Eight thin plate support convex strips 8 are here arranged on the peripheral edge of the bottom plate 5, and seven or less or nine or more are acceptable within the bounds of not hampering putting in and taking out of the vacuum tweezers. Furthermore, the thin plate support convex strip 8 is provided in the vicinity of peripheral edge of the bottom plate 5, and may be also provided on the whole bottom plate 5 to the extent that does not hinder the vacuum tweezers from being put in and taken out.

The engagement piece 9 is a member that abuts the peripheral edge of the semiconductor wafer 4 placed on the thin plate support convex strip 8 and prevents side slippage of the semiconductor wafer 4. The engagement piece 9 is provided at an end of the thin plate support convex strip 8. The engagement piece 9 is arranged on a slightly larger circumference than an outer diameter of the semiconductor wafer 4 placed on the thin plate support convex strip 8. Moreover, an abutting surface of the engagement piece 9 is bent around the peripheral edge of the semiconductor wafer 4. When the semiconductor wafer 4 slips sideways, the bent abutting surface of the engagement piece 9 abuts the peripheral edge of the semiconductor wafer 4 for stoppage of its side slip. The engagement piece 9 also has a function of preventing the side slip and rotation of the bottom side support member 35. More precisely, a seating portion 9A on a base part of the engagement piece 9 performs this function. The seating portion 9A abuts a positioning projection 38B of an outer periphery support part 38 of the bottom side support member 35, which is described later, to position and support the bottom side support member 35. Total eight positioning projections 38B are provided on the four sides, two each on one side, and each of them abuts each of the seating portions 9A, thereby positioning and supporting the bottom side support member 35. This prevents the side slip and rotation of the bottom side support member 35.

The bottom plate 5 is set in such a manner that its central part is larger in wall thickness than its peripheral edge. This aims to maintain required strength of the bottom plate 5, and thus the wall thickness of the bottom plate 5 is determined in accordance with the required strength. The bottom plate 5 maybe curved in a conical shape, etc. according to a change in wall thickness. For example, the bottom plate 5 is made with a smooth change in wall thickness, having a central part of 5 mm in maximum wall thickness and a peripheral edge of 2 mm in minimum wall thickness. In this case, as necessary, the bottom plate 5 is curved in the shape of a cone, etc. according to the change of the wall thickness. This structure makes it possible to omit a reinforcing rib to be placed on a backside of the bottom plate 5 while maintaining the required strength, whereby this part can be easily cleaned and well drained with no projections and depressions. As a consequence, this structure brings about an improvement in cleaning efficiency.

Figure 9:
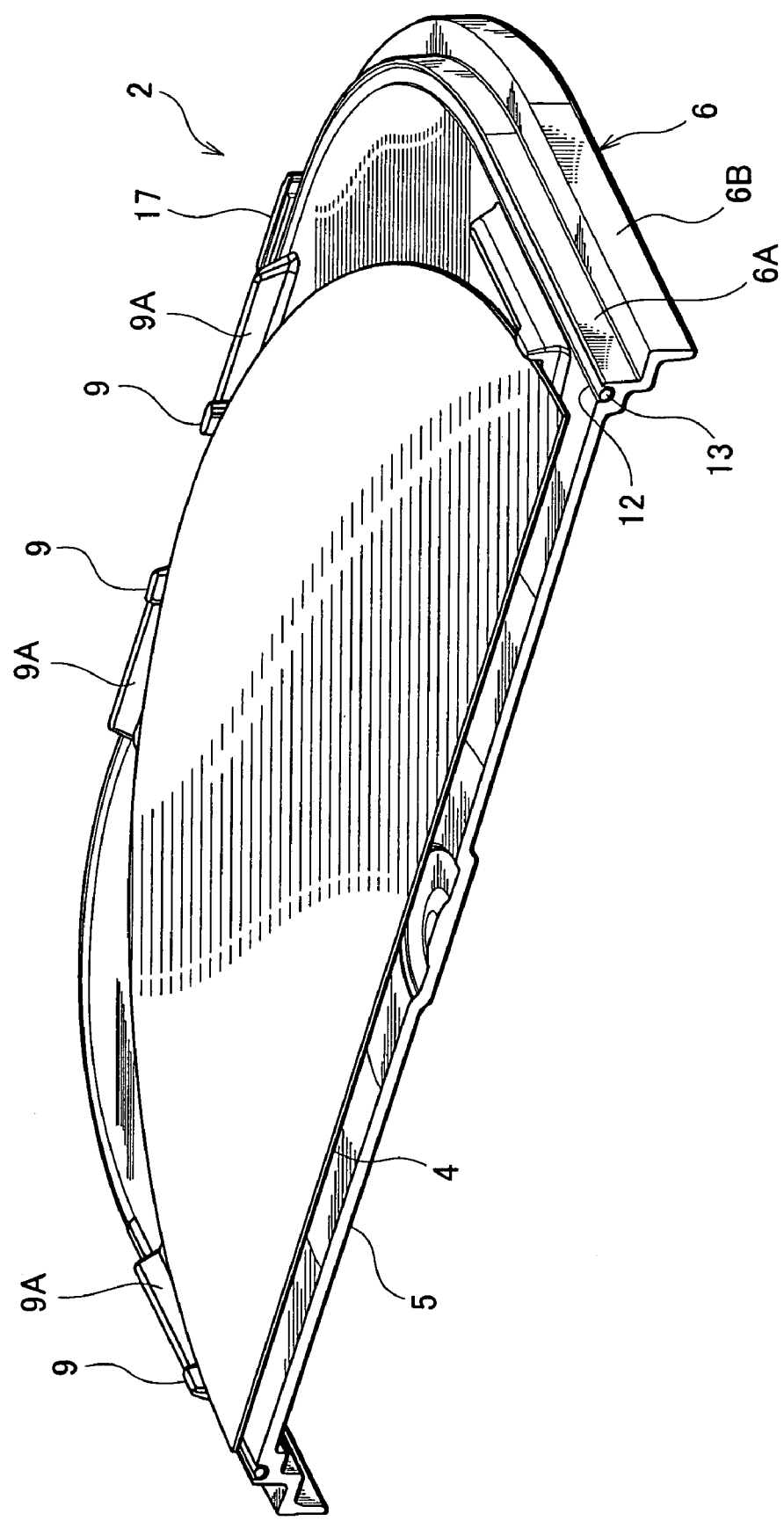
FIG. 9 is a perspective view showing a semiconductor wafer placed on the main body of the single thin plate storage container in cross section according to the embodiment of the present invention.
Figure 10:
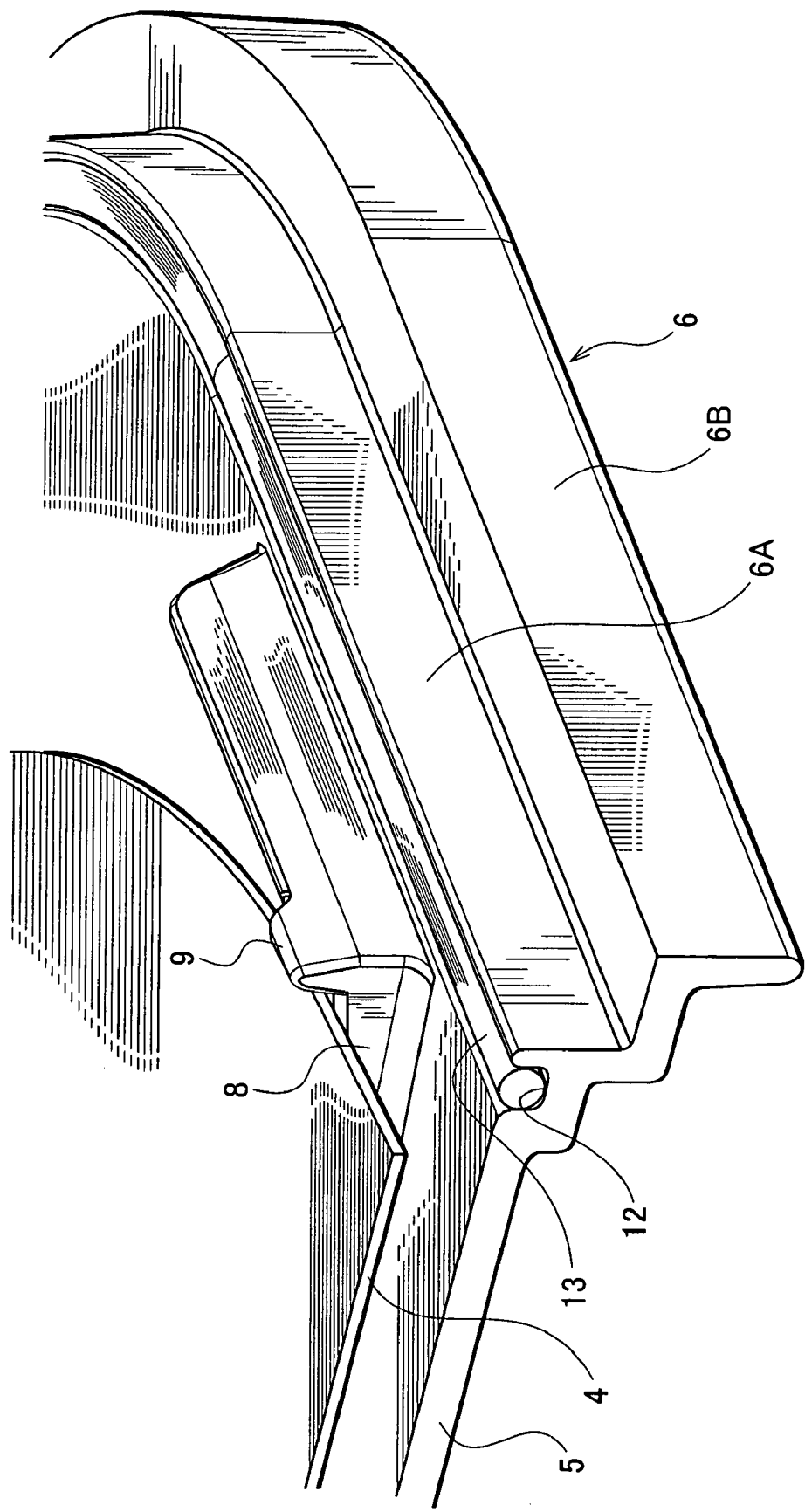
FIG. 10 is an enlarged perspective view showing the main portion of the main body of the single thin plate storage container in cross section according to the embodiment of the present invention.

The peripheral wall 6 droops downward from the peripheral edge of the bottom plate 5, as shown in FIG. 9. The peripheral wall 6 is provided with two stages. A seal groove 12 is provided around a perimeter of an upper surface of a first stage 6A, and a seal material 13 is attached to the seal groove 12. By putting the lid 3 on the main body 2, a lower surface of a first stage 22A of the peripheral wall 22 of the lid 3 abuts and crushes in the seal material 13, whereby the single thin plate storage container 1 is sealed inside in an airtight manner. The first stage 6A of the peripheral wall 6 constitutes a convex fitting part for fitting into a concave fitting part (22B) of the lid 3 described later.

A second stage 6B constitutes a concave fitting part for fitting into a convex fitting part (22A) of the lid 3 described later. The second stage 6B is provided with a hinge fitting part 15 and a hook fitting part 16, as shown in FIGS. 4 to 7. Fitted into the hinge fitting part 15 is a hinge 17 described later for supporting the lid 3 rotatably with respect to the main body 2. The hinge fitting part 15 is composed of a concave portion formed in an almost same size as a fitting piece 17A of the hinge 17 described later. The fitting piece 17A of the hinge 17 is fitted into and coupled tightly with the hinge fitting part 15.

The hook fitting part 16 is a concave portion for a hook 18 described later to fit into the concave portion. The hook 18 is fitted into between the hook fitting part 16 and a hook fitting part 29 of the lid 3 described later, thereby fastening the lid 3 to the main body 2. The hook fitting part 16 is composed of a concave portion formed in an almost same size as the hook 18. In combination with the hook fitting part 29 of the lid 3, the hook fitting part 16 of the main body 2 is formed as a concave portion in almost same shape as the hook 18. A cylindrical fitting projection 19 is provided on both side walls of the hook part 16. The fitting projection 19 is fitted into a fitting concave part 18B of the hook 18 described later, thereby fastening the main body 2 and the lid 3 to each other.

Figure 11:
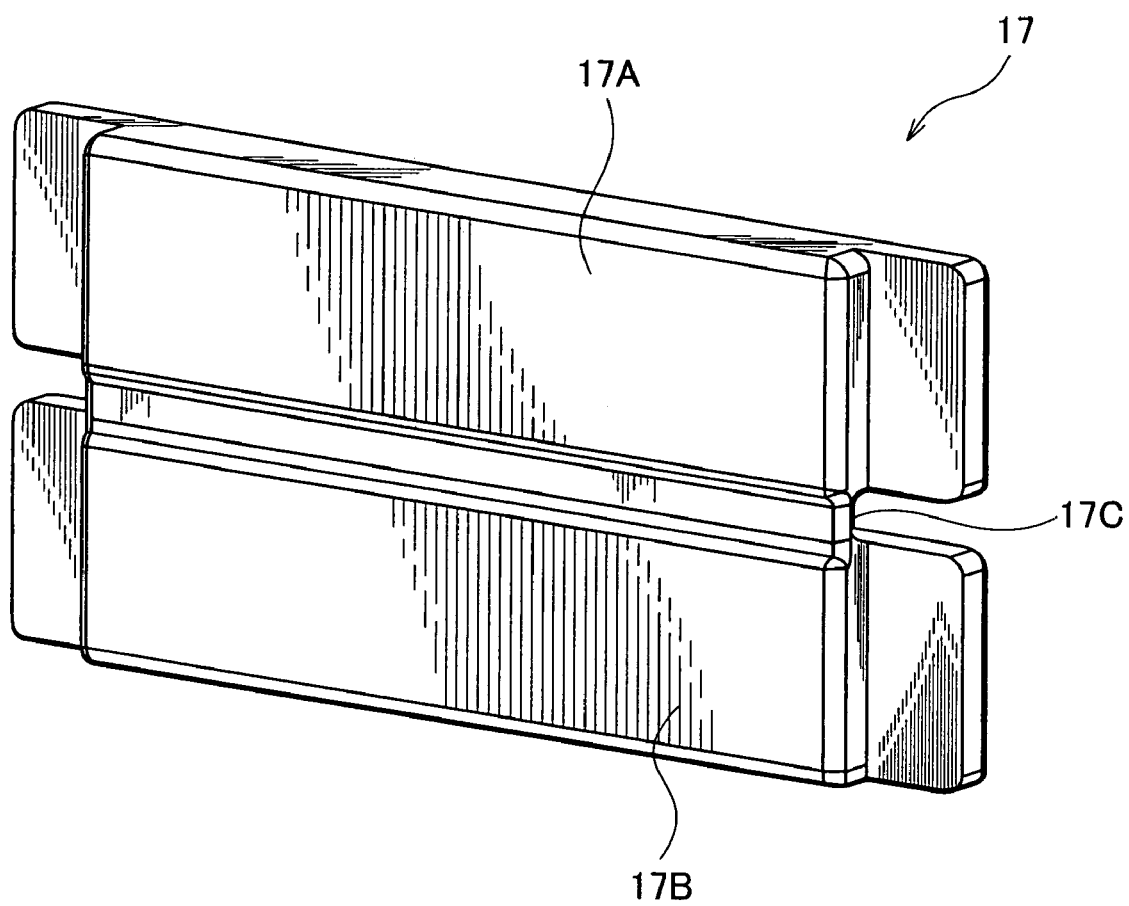
FIG. 11 is a perspective view showing a hinge of the single thin plate storage container according to the embodiment of the present invention from the front side.
Figure 12:
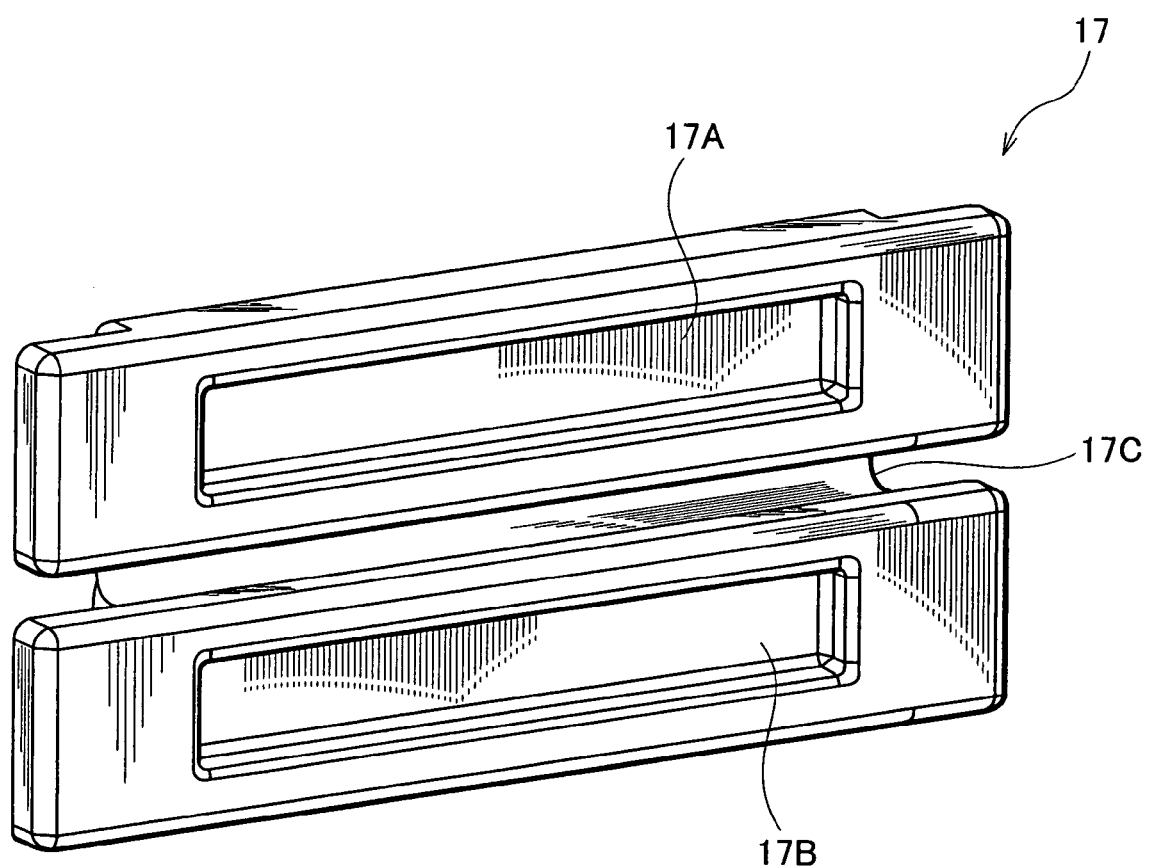
FIG. 12 is a perspective view showing, from the rear side, the hinge of the single thin plate storage container according to the embodiment of the present invention.

The hinge 17 is composed of two fitting pieces 17A, 17B and a thin-walled part 17C between the fitting pieces 17A, 17B, as shown in FIGS. 11 and 12. The fitting pieces 17A, 17B are members that are fitted into the hinge fitting parts 15, 28, respectively, for joining the main body 2 and the lid 3 to each other. The thin-walled part 17C is a member for supporting the lid 3 rotatably through elimination of a sliding portion and control of dust generation.

The hinge 17 can be separated from and connected to the lid 3 and the main body 2 when the lid 3 forms an opening angle of 90 to 180 degrees with respect to the main body 2. More specifically, when the lid 3 forms an opening angle of 90 to 180 degrees with respect to the main body 2, the hinge 17 can be removed from or attached to the respective hinge fitting parts 15, 28 of the main body 2 and lid 3. In the case of its breakage etc., this hinge 17 must be replaced with a new hinge 17. That is, even if the hinge 17 is broken or so, no efforts are needed except for replacement of the hinge 17.

Figure 13:
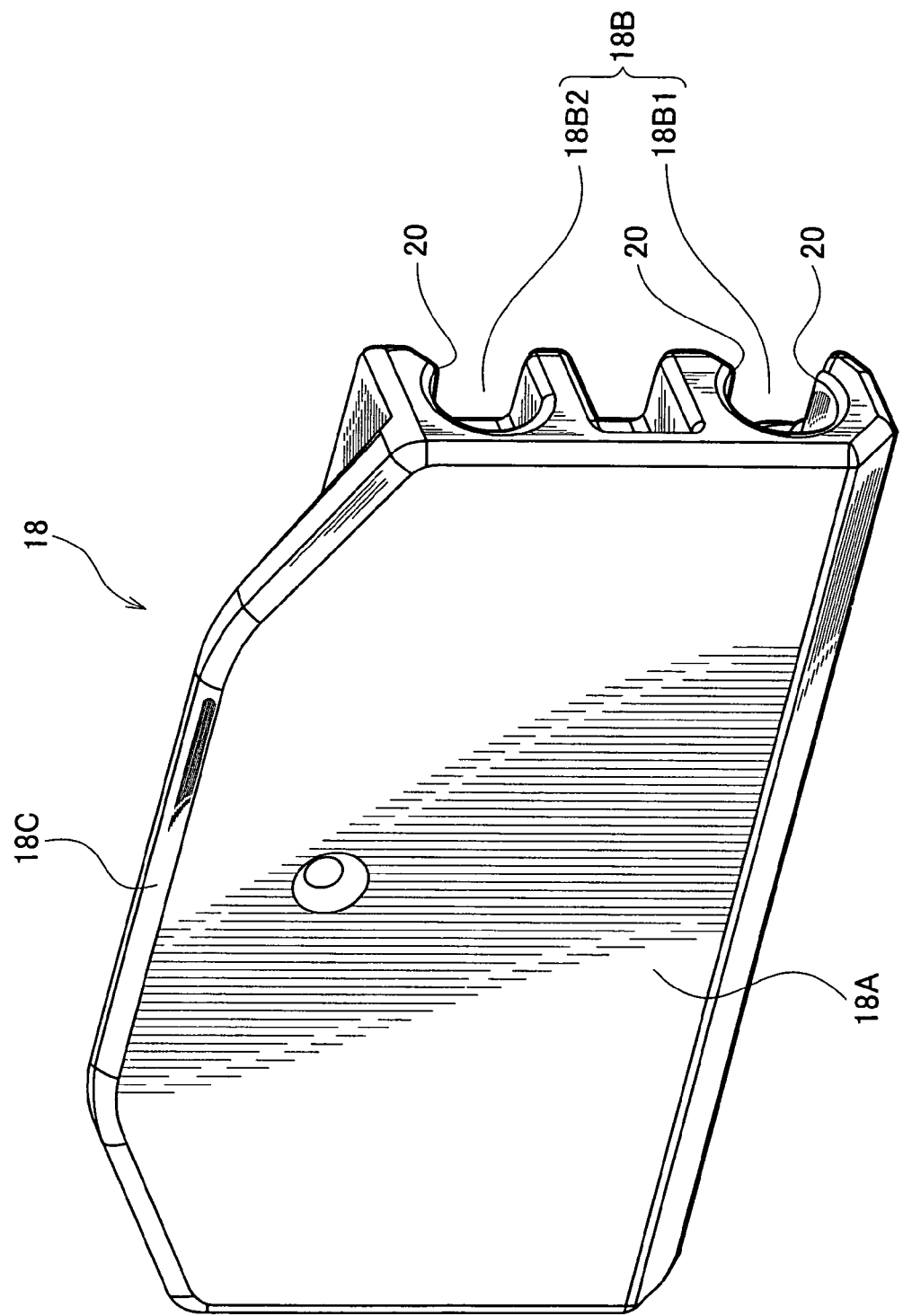
FIG. 13 is a perspective view showing, from a front side, a hook of the single thin plate storage container according to the embodiment of the present invention.
Figure 14:
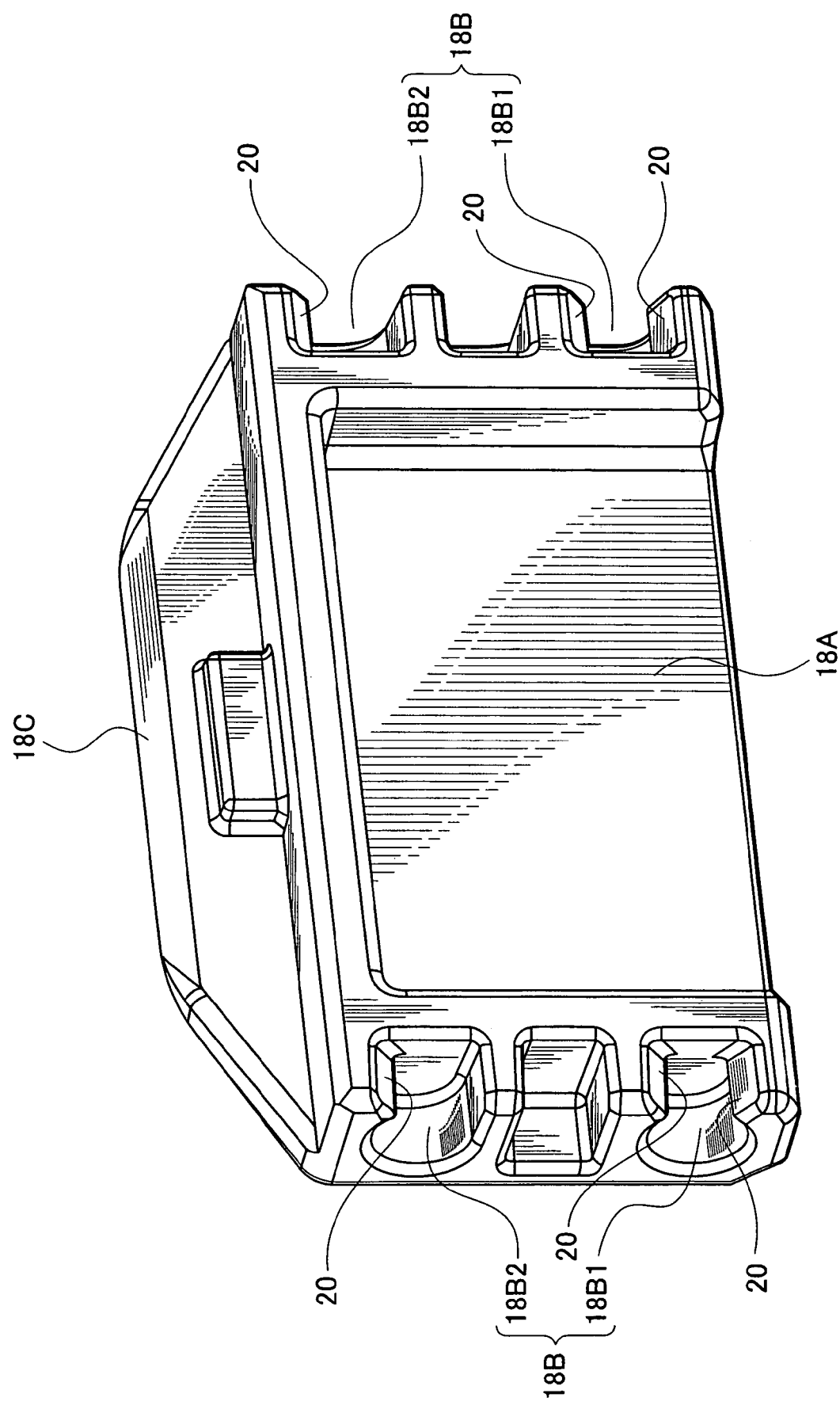
FIG. 14 is a perspective view showing, from the rear side, the hook of the main body of the single thin plate storage container according to the embodiment of the present invention.

The hook 18 is a member for combining the main body 2 with the lid 3 by fitting into the hook fitting part 16 of the main body 2 and the hook fitting part 29 of the lid 3. The hook 18 is composed of a main part 18A, a fitting concave part 18B and a handle 18C, as shown in FIGS. 13 and 14. The main part 18A is formed in the shape of an approximately rectangular plate, and is fitted into a square concave portion formed by the hook fitting part 16 of the main body 2 and the hook fitting part 29 of the lid 3.

The fitting concave part 18B is a member for fastening the lid 3 to the main body 2 by fitting into the respective fitting projections 19, 30 of the hook fitting parts 16, 29. The fitting concave part 18B is composed of a rotation fitting concave part 18B1 and a combination fitting part 18B2. The rotation fitting concave part 18B1 is a part for supporting the hook 18 rotatably by fitting into the fitting projections 19, 30. The rotation fitting concave part 18B1 has an inside surface formed in a circular shape and is provided with a warp-around part 20 on its both ends, whereby this part becomes hard to remove from the fitting projections 19, 30 in which this part is fitted. This allows the hook 18 to be rotatably attached to the main body 2.

The combination fitting part 18B2 is a part that is fitted into the fitting projections 19, 30 in fastening the lid 3 to the main body 2 and that is removed from the fitting projections 19, 30 in opening the lid 3. The combination fitting concave part 18B2 is provided with the warp-around part 20 only on outer surface (upper side surface in FIG. 13) because the part 18B2 needs to be easily fitted into and removed from the fitting projections 19, 30 and also needs to fasten the lid 3 tightly to the main body 2. Its inner surface is flat-shaped so that the part 18B2 does not hinder the fitting projections 19, 30 from being taken in and out. Accordingly, when a force acts on the lid 3 in a direction of opening from the main body 2, the warp-around part 20 supports the fitting projections 19, 30 so as to cover the fitting projections 19, 30 from outside, thereby preventing the hook 18 from coming off. Also, when the hook 18 is fitted or removed, the hook 18 can be easily fitted and removed with application of a light force, although the warp-around part 20 provided only on its one side is a slight obstacle to the fitting projections 19, 30.

The handle 18C is a part to be held with fingers in fitting or removing the hook 18. By holding the handle 18C with fingers and fitting the combination fitting concave part 18B2 into the fitting projections 19, 30, the lid 3 is fastened to the main body 2 or the combination fitting concave part 18B2 is removed from the fitting projections 19, 30 to open the lid 3.

Besides, the hook 18 may be attached with the handle 18C facing upward or downward.

Figure 15:
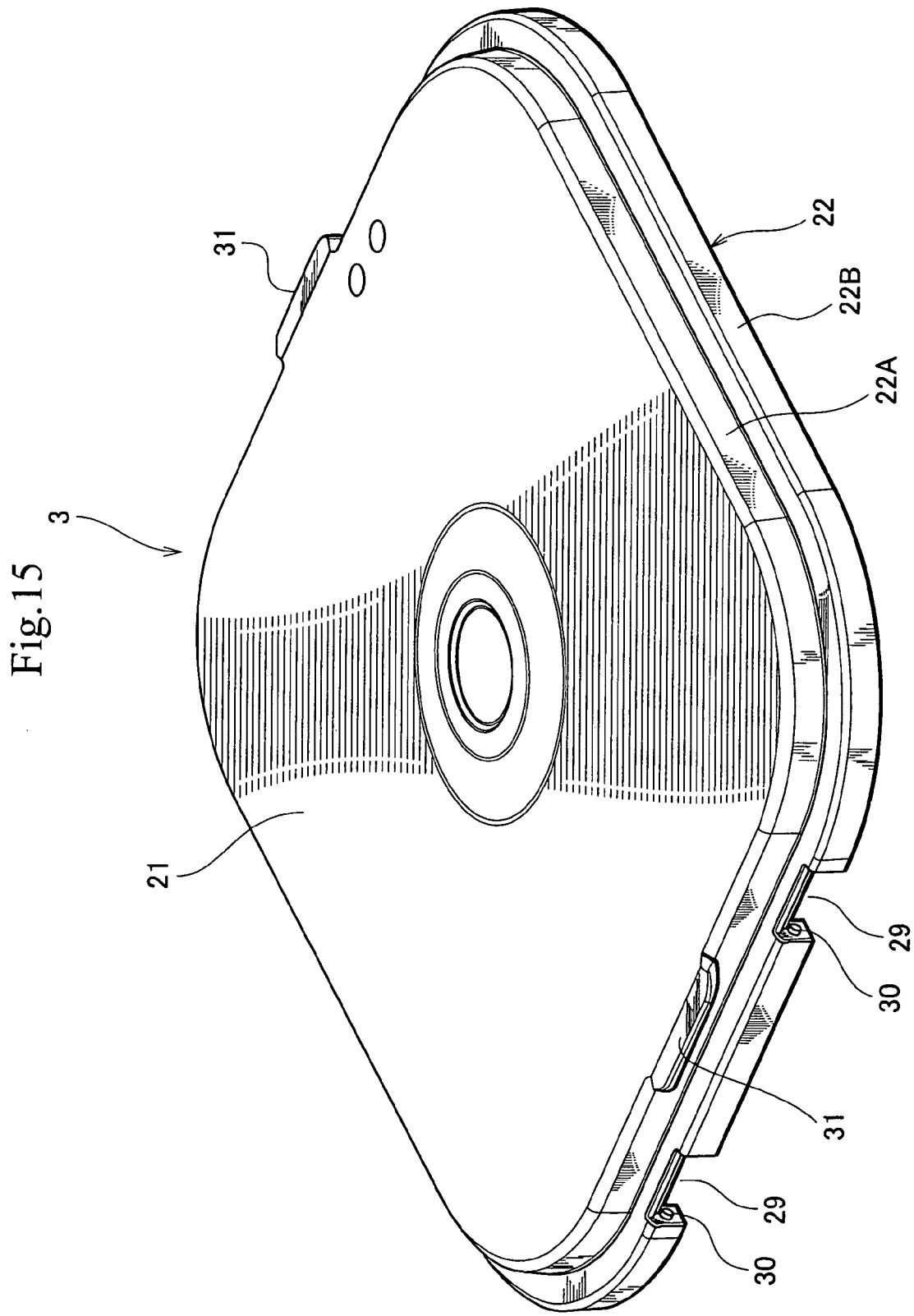
FIG. 15 is a perspective view showing, from an upper side, a lid of the single thin plate storage container according to the embodiment of the present invention.
Figure 16:
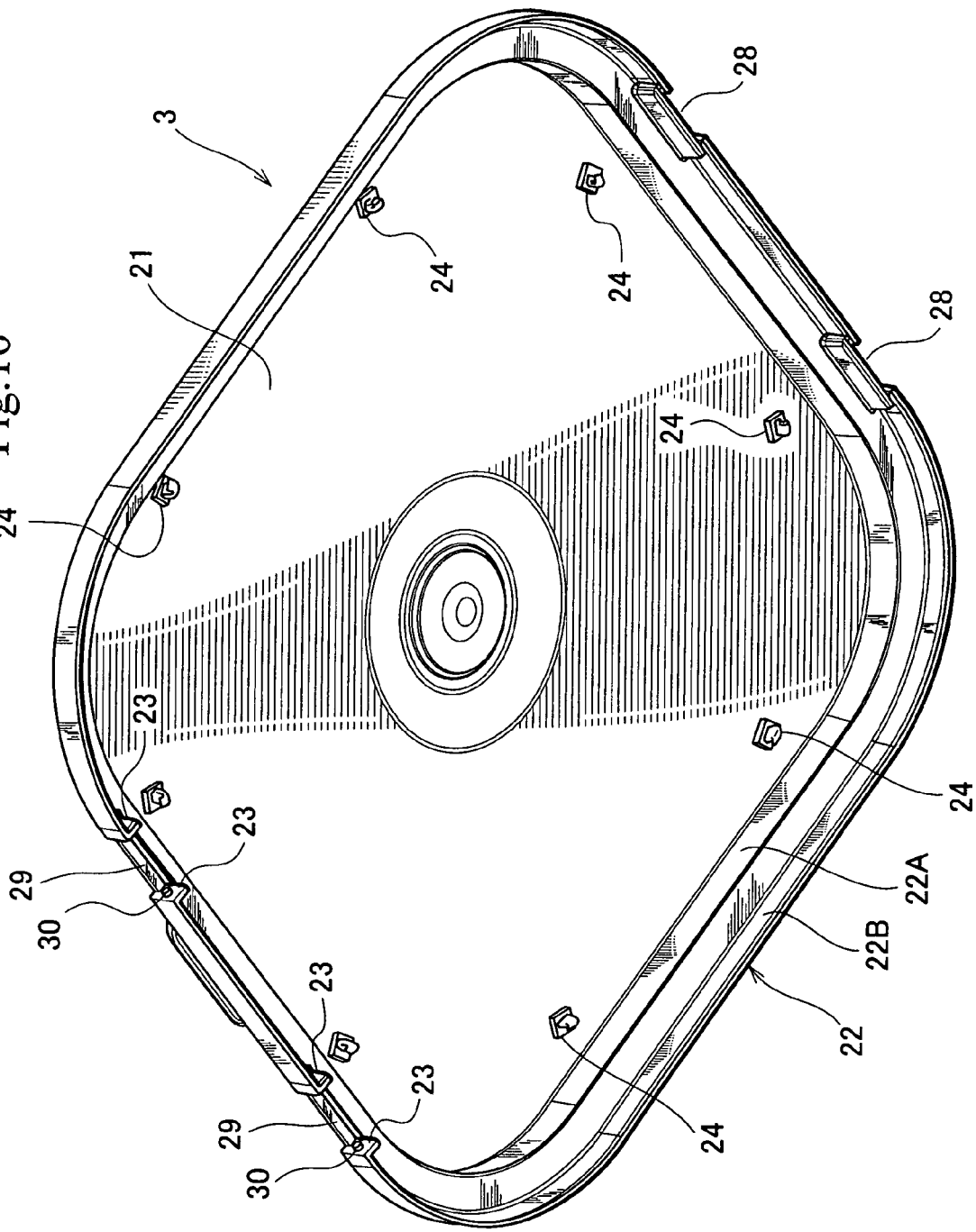
FIG. 16 is a perspective view showing, from the lower side, the lid of the single thin plate storage container according to the embodiment of the present invention.

The lid 3 is formed in an almost same shape as the main body 2 as shown in FIGS. 15 and 16. Thus, in stacking the single thin plate storage containers 1, the main body 2 of the upper single thin plate storage container 1 can be fitted into the lid 3 of the lower single thin plate storage container 1, resulting in a stable and compact stack. For example, one example of single thin plate storage containers 1 of the present embodiment of 41 mm in overall height become 76 mm high when stacked in two layers. On the contrary, the conventional single thin plate storage containers of 49.5 mm in overall height become 90 mm when stacked in two layers. Consequently, with an increase in the number of layers, the height of stacking can be substantially reduced as compared with the conventional art.

More specifically, the lid 3 is composed of a top plate 21, a peripheral wall 22 and a lid guide 23. The top plate 21 is a member for covering from the upper side the semiconductor wafer 4 placed on the bottom plate 5 of the main body 2. The top plate 21 has its central part larger in wall thickness than its peripheral edge, as with the bottom plate 5. This is for the purpose of maintaining required strength of the top plate 21, and thus its wall thickness is set in accordance with the required strength. This makes it possible to omit a reinforcing rib to be placed on a backside of the top plate 21, which eliminates projections and depressions and achieves an improvement in cleaning efficiency.

Provided on the inner surface of top plate 21 of the lid 3 is a retainer fitting part (not shown) into which a retainer 24 described later is fitted. The eight retainer fitting parts are arranged on the inside surface of the top plate 21. Each of the retainer fitting parts is provided on the inside surface of the top plate 21 so as to face toward the peripheral edge of the semiconductor wafer 4 placed on the bottom plate 5 of the main body 2.

The peripheral wall 22 drops downward from the surrounding of the top plate 21. The peripheral wall 22 is formed so as to have two stages, as with the peripheral wall 6 of the main body 2. In accordance with this, the bottom plate 5 of the main body 2 and the top plate 21 and peripheral wall 22 of the lid 3 form a space for storing the semiconductor wafer 4, with the lid 3 placed on the main body 2. A first stage 22A constitutes a convex fitting part that fits into the concave fitting part (6B) of the main body 2 from underside. A second stage 22B constitutes a concave fitting part that fits into the convex fitting part (6A) of the main body 2 from upper side.

An abutting surface is provided on a whole circumference of lower side of the first stage 22A of the peripheral wall 22. The abutting surface abuts the seal material 13 on the main body 2 side to seal inside the single thin plate storage container 1 in an airtight manner. The second stage 22B is formed in such a manner that its peripheral surface is flush with the peripheral surface of the second stage 6B formed on the main body 2. That is, with the main body 2 and the lid 3 closed with each other (see FIG. 1), the second stage 22B is formed in such a manner that the joined portions of the two parts are flush with each other. This is because a sealing tape may need to be stuck on the flush joined portions without provision of the seal material 13.

The lid guide 23 is a guide for guiding the lid 3 and the main body 2 in placing the lid 3 on the main body 2 so that the lid 3 and the main body 2 are not misaligned. The lid guide 23 projects inward from both sides of the hook fitting part 29 of the lid 3, and is opposed to the peripheral wall 6 of the main body 2 with a slight clearance therefrom when the lid 3 is placed on the main body 2. Accordingly, when the lid 3 is being rotated around the hinge 17 to cover the main body 2, the lid guide 23 guides the lid 3 for correction of any misalignment. The lid 3 is supported by the two hinges 17 and thus will not be out of alignment in general. However, if the lid 3 becomes shifted in position from the main body 2 for some reason, the lid guide 23 abuts the peripheral wall 6 of the main body 2 for guidance. The lid guide 23 may be provided on the main body 2 side, or may be provided on both side of the main body 2 and the lid 3.

An abutting surface is provided on a whole circumference of lower side of the first stage 22A of the peripheral wall 22. The abutting surface abuts the seal material 13 on the main body 2 side to seal inside the single thin plate storage container 1 in an airtight manner. The second stage 22B is formed in such a manner that its peripheral surface is flush with the peripheral surface of the second stage formed on the main body 2. That is, with the main body 2 and the lid 3 closed with each other (see FIG. 2), the second stage is formed in such a manner that the joined portions of the two parts are flush with each other. This is because sealing tape may need to be stuck on the slush juncture without provision of the seal material 13.

The hinge fitting part 28 is provided on the lid 3 at a position opposed to the hinge fitting part 15 of the main body 2. The hinge 17 for supporting the lid 3 rotatably with respect to the main body 2 is fitted into the hinge fitting part 28. As with the hinge fitting part 15, the hinge fitting part 28 is composed of a concave portion formed in an almost same size as the fitting piece 17A of the hinge 17. The fitting piece 17A of the hinge 17 is fitted into and combined tightly with the hinge fitting part 28.

The hook fitting part 29 is provided on the lid 3 at a position opposed to the hook fitting part 16 of the main body 2. The hook fitting part 29 and the hook fitting part 16 of the main body 2 are structured in almost same manner forming a mirror symmetry. Combining the hook fitting part 29 with hook fitting part 16 of the main body 2 constitutes a concave portion that is almost same in size and shape as the hook 18.

The cylindrical fitting projection 30 is provided on the both side walls of the hook fitting part 29, similar to the fitting projection 19 on the hook fitting part 16 of the main body 2. The fitting projection 30 is fitted into the fitting concave part 18B of the hook 18, described later, to fasten the main body 2 and the lid 3 to each other.

An engagement flange 31 for carrying the single thin plate storage container 1 is provided on a peripheral edge of upper side of the top plate 21. The engagement flange 31 is composed of a plate projecting horizontally from the top plate 21. Two engagement flanges 31 are arranged as opposed to the positions of the hinge fitting part 28 and the hook fitting part 29. The attachment position and shape, etc. of the engagement flange 31 are set appropriately according to the shape of arm of the transfer apparatus side (not shown).

Figure 17:
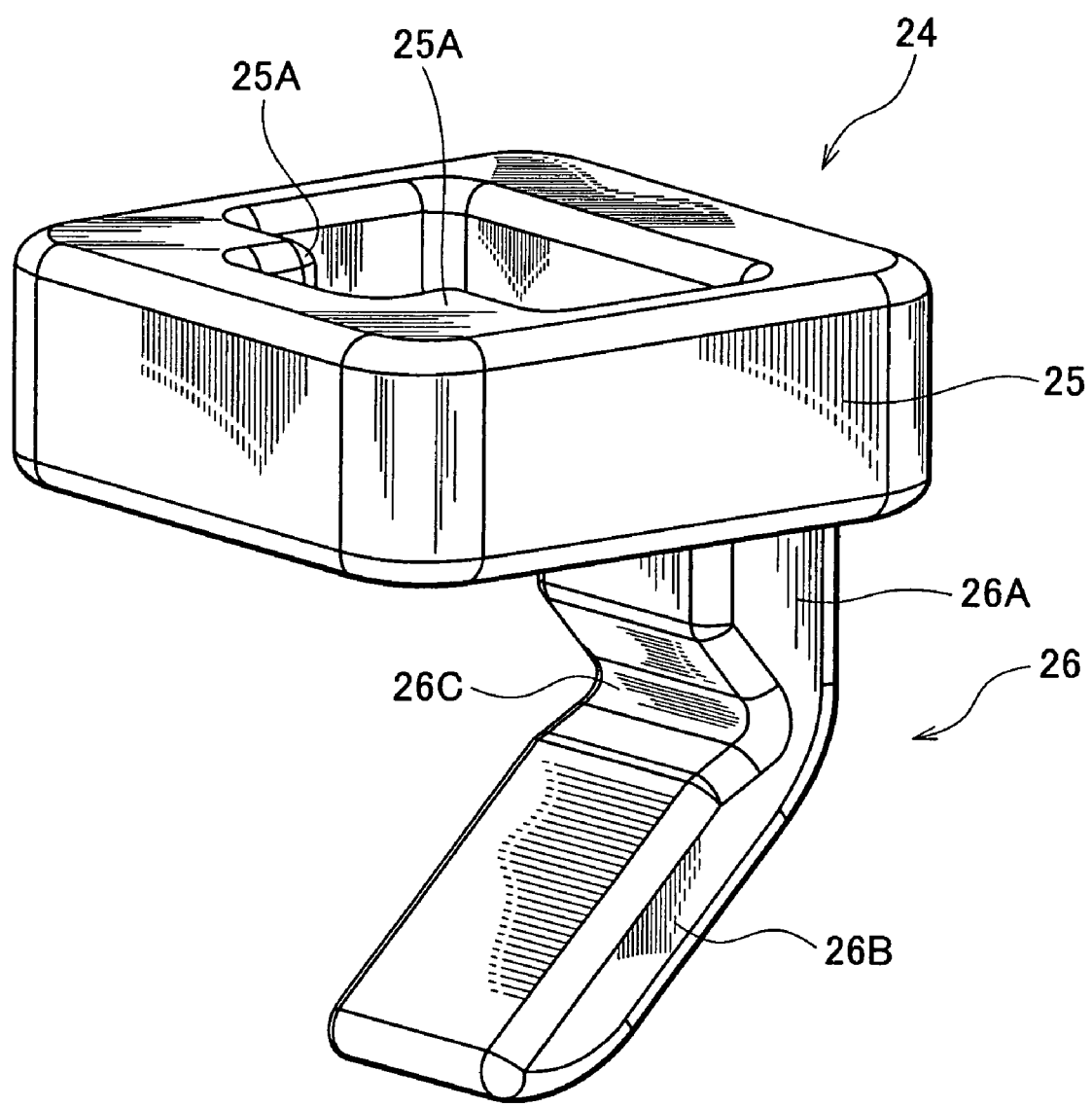
FIG. 17 is a perspective view showing, from the upper side, a retainer of the single thin plate storage container according to the embodiment of the present invention.
Figure 18:
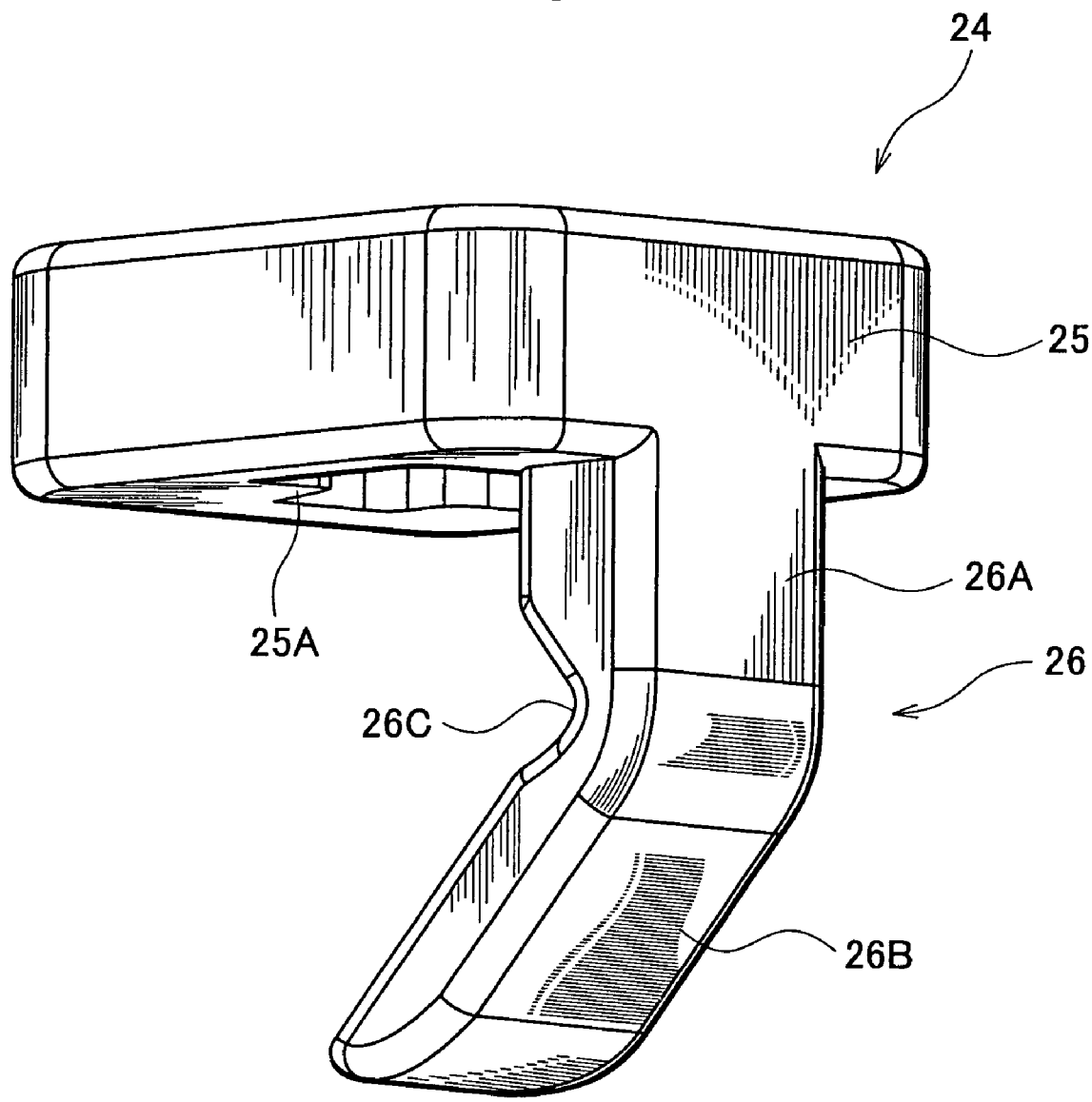
FIG. 18 is a perspective view showing, from the lower side, the retainer of the single thin plate storage container according to the embodiment of the present invention.
Figure 19:
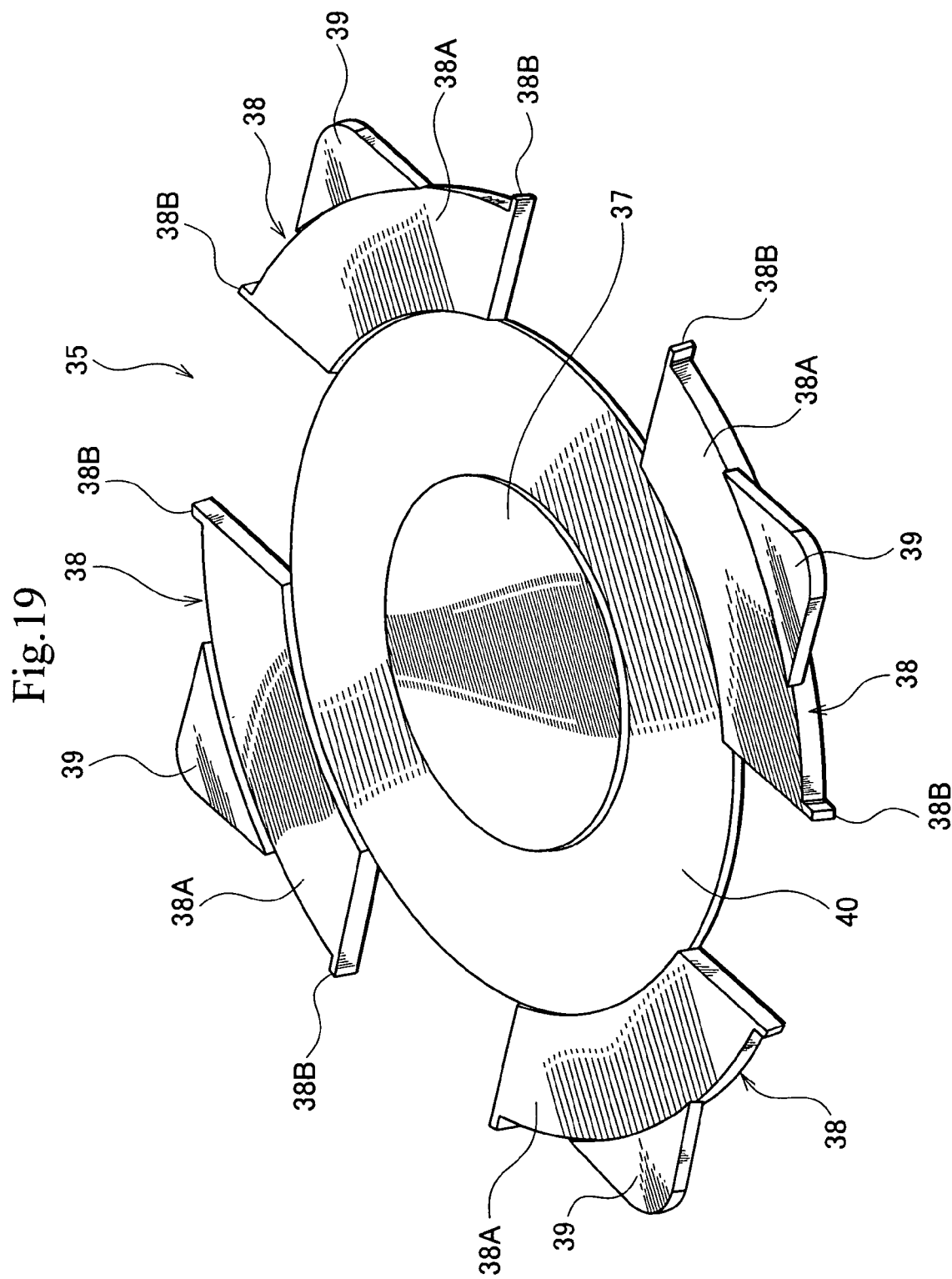
FIG. 19 is a perspective view showing, from the upper side, a bottom side support member of the single thin plate storage container according to the embodiment of the present invention.
Figure 20:
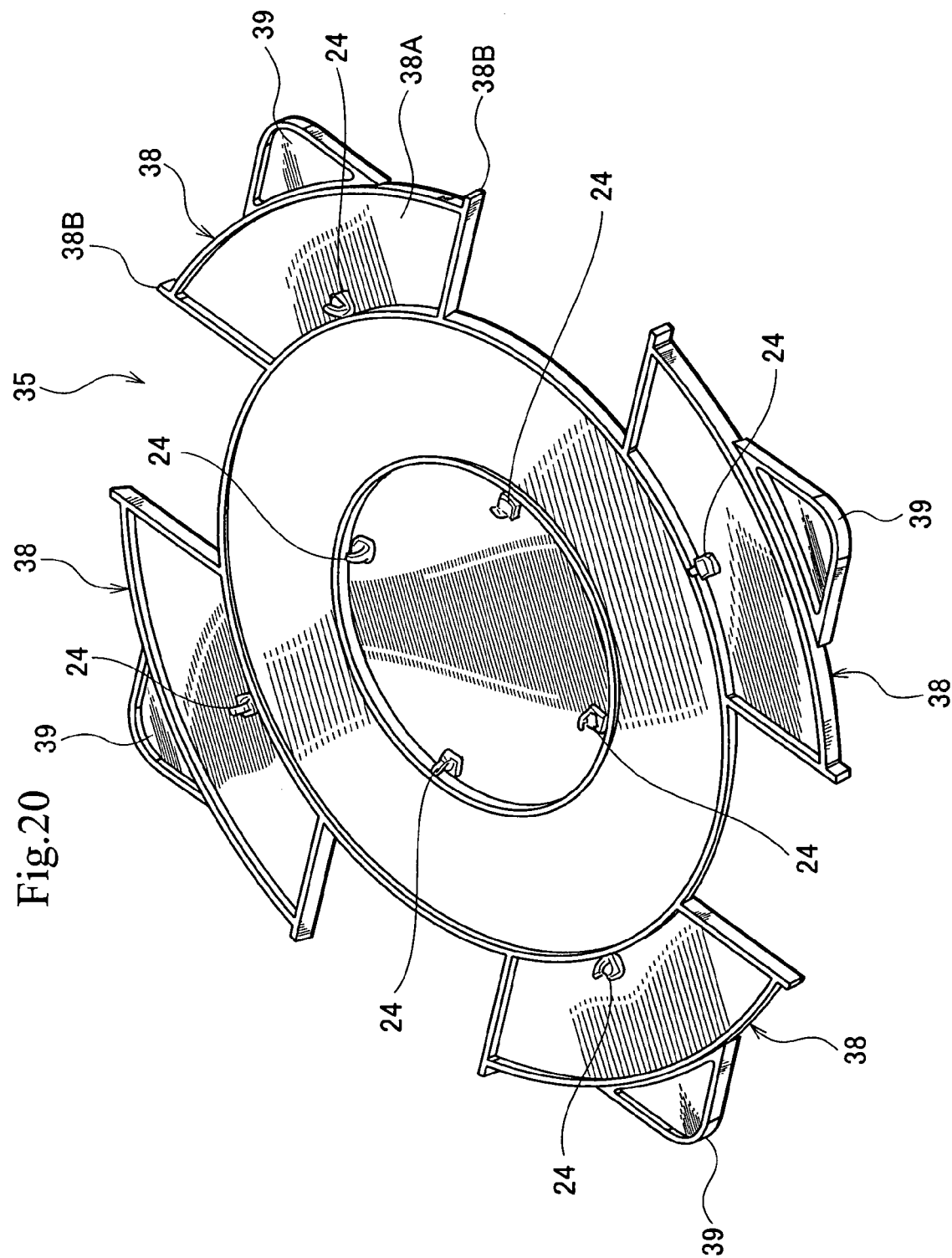
FIG. 20 is a perspective view showing, from the lower side, the bottom side support member of the single thin plate storage container according to the embodiment of the present invention.
Figure 21:
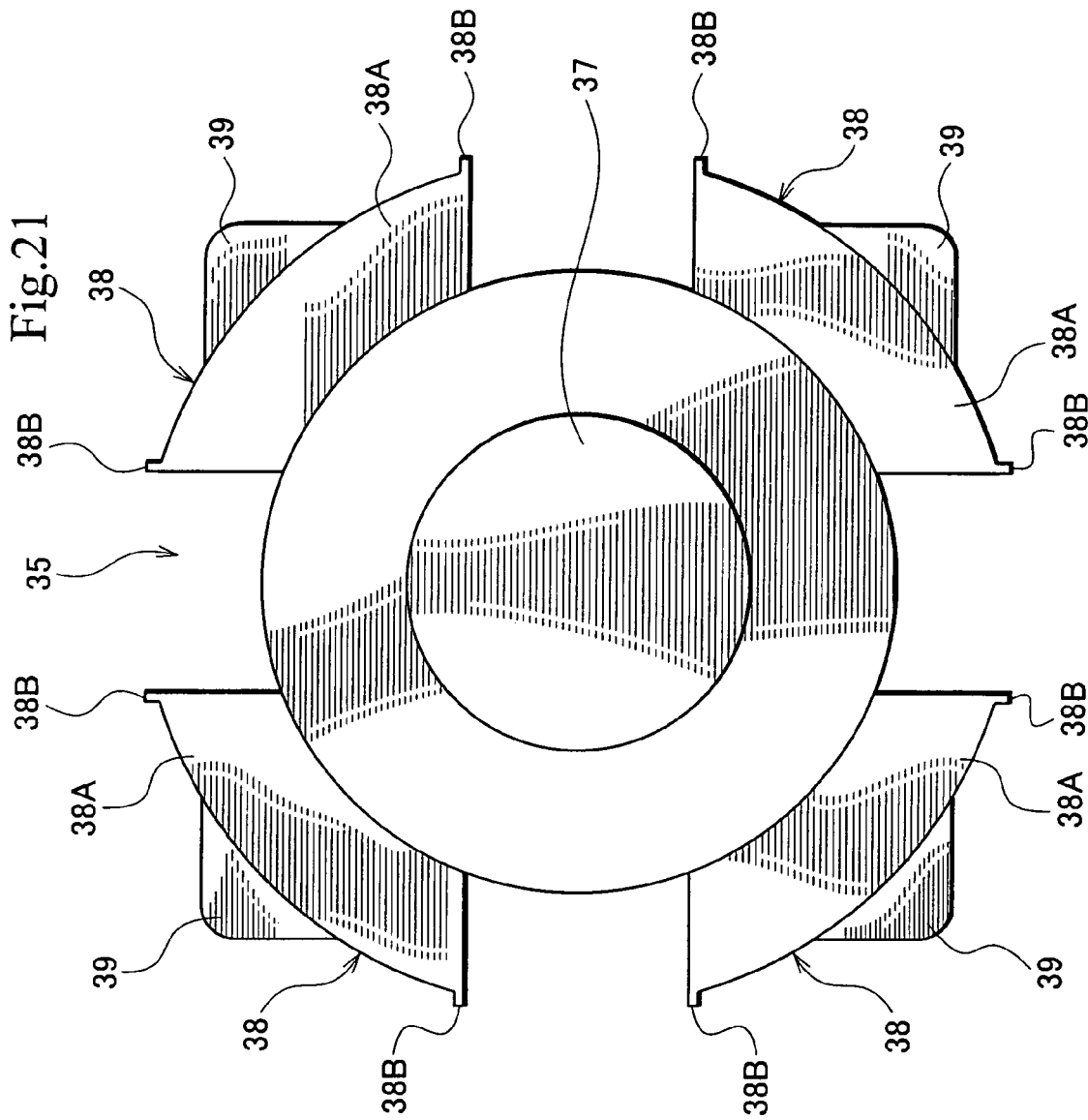
FIG. 21 is a plane view showing a bottom side support member of the single thin plate storage container according to the embodiment of the present invention.
Figure 22:
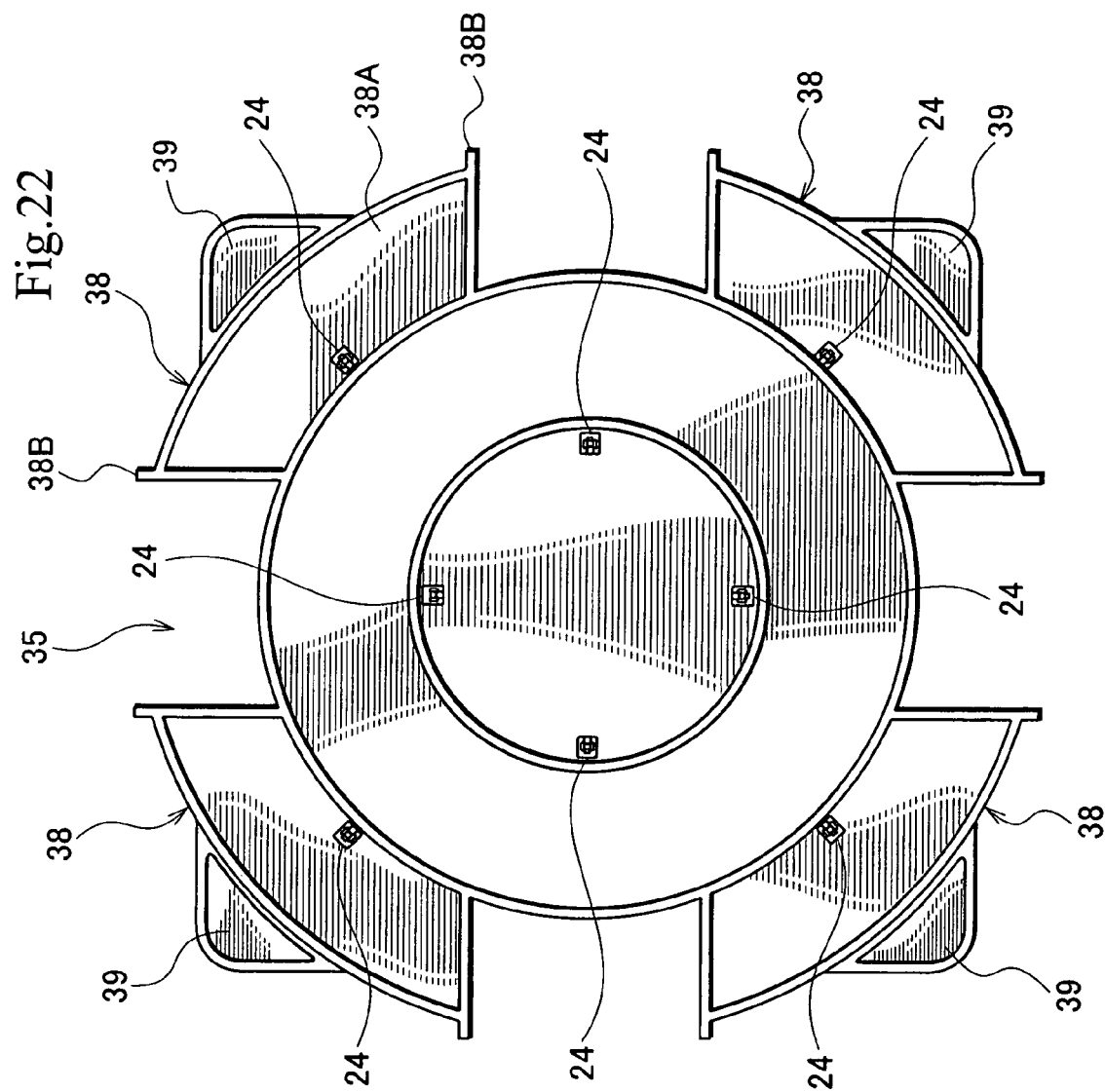
FIG. 22 is a bottom side view showing the bottom side support member of the single thin plate storage container according to the embodiment of the present invention.

The retainer 24 is a member for supporting the peripheral edge of the semiconductor wafer 4 placed on the bottom side support member 35. The retainer 24 is made of an elastic synthetic resin. As shown in FIGS. 17 and 18, the retainer 24 is composed of a base 25 and a bending piece 26. The base 25 is a part for fitting into the retainer fitting part of top plate 21 of the lid 3. The base 25 is formed in the shape of an almost square ring, and a projection 25A is provided at two corners of the square ring for conformance to the shape of the retainer fitting part. The base 25 is fitted into the projecting retainer fitting part, whereby the retainer 24 is securely attached to the retainer fitting part. The retainer fitting part is a projection of a square pole or similar shape provided on the lid 3. By fitting the projection into the square ring-shaped base 25, the retainer 24 can be attached to the lid 3.

The bending piece 26 is a part for abutting and supporting the semiconductor wafer 4. The bending piece 26 extends from the base 25 toward the semiconductor wafer 4. The bending piece 26 is composed of a base end piece 26A, a front end piece 26B, and a thin-walled portion 26C. The bending piece 26 is made of an elastic synthetic resin and thus the thin-walled portion 26C is considerably bent more than the base end piece 26A and the front end piece 26B. The base end piece 26A and the front end piece 26B are bent around the thin-walled portion 26C, thereby supporting elastically the semiconductor wafer 4. Moreover, since the front end piece 26B is inclined with respect to the base end piece 26A, when the front end piece 26B abuts the peripheral edge of the semiconductor wafer 4, the front end piece 26B presses elastically the semiconductor wafer 4 in radially inward and downward directions.

Next, a shock-absorbing support member 34 will be described below. The shock-absorbing support member 34 can be used by just placing it on the main body 2 of the above mentioned single thin plate storage container 1. The shock-absorbing support member 34 is composed of the bottom side support member 35 and the front side support member 36.

The bottom side support member 35 is a member located on the side of the main body 2 for supporting a thin wafer from the bottom side. The bottom side support member 35 is placed on the bottom plate 5 of the main body 2. As shown in FIGS. 19 to 22, the bottom side support member 35 is composed of a center support part 37 for supporting a central part of a thin wafer 4A (see FIG. 1) from the bottom side, an outer periphery support part 38 for supporting an outer periphery of the thin wafer 4A from the bottom side, a peripheral edge support part 39 for abutting a peripheral edge of the thin wafer 4A and supporting the thin wafer 4A radially from outside, and a ring plate 40 located between the center support part 37 and the outer periphery support part 38 for integrally supporting the center support part 37 and the outer periphery support part 38. The bottom side support member 35 is made of a non-electrostatic polymeric material.

The center support part 37 is formed by protruding the central part of the bottom side support member 35 in the shape of a disc, and supports the central part of the thin wafer 4A.

The outer periphery support part 38 supports the outer periphery of the thin wafer 4A by a constant width. The outer periphery support part 38 is formed in the shape of a fragmentary circular ring. More specifically, this part is formed by splitting a circular ring in four. That is, the outer periphery edge support part 38 is composed of four support pieces 38A. The support pieces 38A are spaced more widely than the adjacent thin plate support convex strips 8 on the bottom plate 5. Accordingly, when the bottom side support member 35 is placed on the bottom plate 5 of the main body 2, the aforesaid thin plate support convex strips 8 are located between the support pieces 38A of the outer periphery support part 38. The positioning projections 38B are arranged on both outside edges of support piece 38A of the outer periphery support part 38 in such a manner as to abut the seating portion 9A of the bottom plate 5 and position the bottom side support member 35 for prevention of side slip and rotation. This allows the bottom side support member 35 to abut the positioning projections 38B of the support pieces 38A to the seating portions 9A arranged by two each on the four sides of the bottom plate 5 of the main body 2, whereby the bottom plate support member 35 can be accurately positioned with respect to the main body 2. At the same time, the eight positioning projections 38B abuts against and supported by the eight seating portions 9A, so that the bottom side support member 35 is prevented from slipping sideways and turning.

The peripheral edge support part 39 is integrally attached to an outside of the outer periphery support part 38. This allows the peripheral edge support part 39 to support the thin wafer 4A placed on the outer periphery support part 38 radially from outside. The peripheral edge support parts 39 are arranged on a slightly larger circumference than the outer diameter of the thin wafer 4A. The abutting surface of the peripheral edge support part 39 is curved around the peripheral edge of the thin wafer 4A. The plane shape of the peripheral edge support part 39 is formed of an almost triangle so as to conform to the four corners of the bottom plate 5 of the main body 2.

The ring plate 40 is a part for combining integrally the center support part 37 and the outer peripheral support part 38. The ring plate 40 is lowered by one stage than the center support part 37 and the outer peripheral support part 38 in order to provide a space 41 (see FIG. 1) between the thin wafer 4A placed on the center support part 37 and the outer periphery support part 38. The space 41 is a space for putting in or taking out the vacuum tweezers, etc. in a lateral direction.

The retainer 24 is provided on the backside of the bottom side support member 35 for elastically supporting the bottom side support member 35. In the bottom side support member 35, four retainer fitting parts are provided on a backside of the center support part 37, and one each retainer fitting part (not shown) on each of the support pieces 38A of the outer periphery support part 38. The retainers 24 are attached to these retainer fitting parts. The retainer 24 is the same as the retainer 24 provided on the inside surface of the above mentioned lid 3. With the retainers 24, when the bottom side support member 35 is placed on the bottom plate 5 of the main body 2, the bending pieces 26 of the retainers 24 are bent through contact with the bottom plate 5, thereby elastically supporting the bottom side support part 35 on the bottom plate 5. With this, the thin wafer 4A is sandwiched between the bottom side support member 35 and the front side support member 36, and is supported in a state of being elastically floated with respect to the main body 2 and the lid 3, by each retainer 24 of the bottom side support member 35, a disc 43 of the front side support member 36, and the retainer 24 of the lid 3 with absorption of external shock. In addition, the thin wafer 4A is also elastically supported in a radial direction by the retainer 24 of the lid 3 in such a manner as to absorb external shock.

Figure 1:
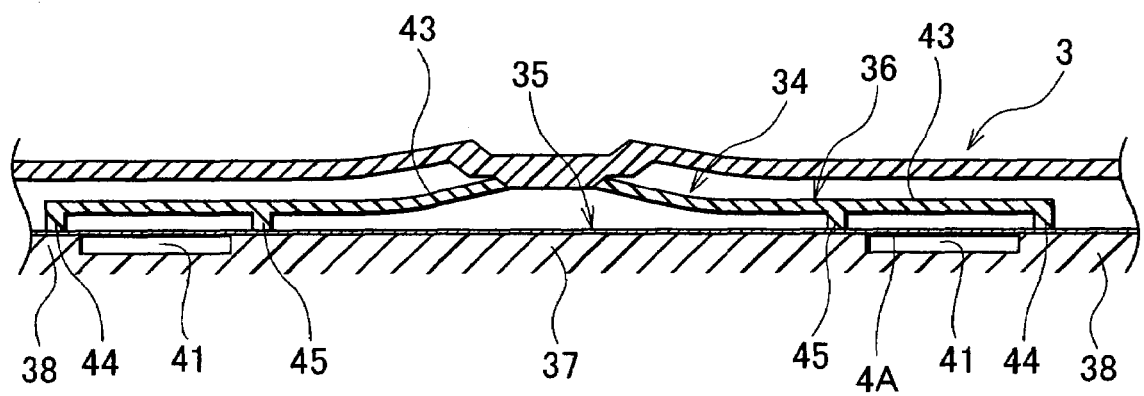
FIG. 1 is a cross-sectional view showing shock-absorbing support members as a main portion for a single thin plate storage container according to embodiments of the present invention.
Figure 23:
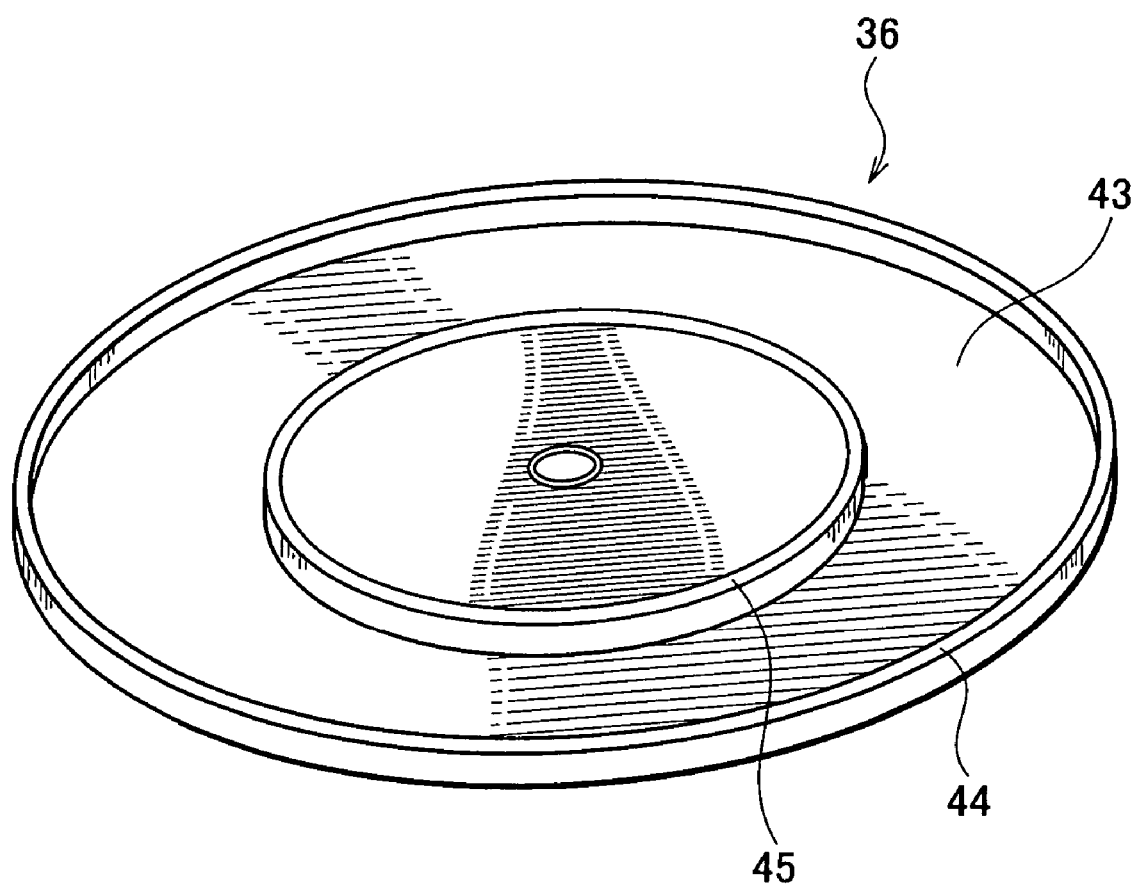
FIG. 23 is a perspective view showing, from the lower side, a front side support member of the single thin plate storage container according to the embodiment of the present invention.

The front side support member 36 is a member that is attached to the lid 3 side and supports elastically the thin wafer 4A from the front side. The front side support member 36 is composed of the disc 43, a peripheral edge abutting part 44, and a center abutting part 45, as shown in FIGS. 1 and 23.

The disc 43 is an elastic support part that covers the thin wafer 4A from the upper side in order to support elastically the peripheral edge abutting part 44 and the center abutting part 45. The disc 43 is fastened at its central part to the inside surface of the lid 3, and its outer periphery constitutes a free end capable of being elastically bent. The peripheral edge abutting part 44 and the center abutting part 45 are provided on the outer periphery capable of being elastically bent.

The peripheral edge abutting part 44 is a part for supporting the thin wafer 4A at the peripheral edge. The peripheral edge abutting part 44 is provided on the peripheral edge of the disc 43 so as to face in a downward direction. Thus, the peripheral edge abutting part 44 is opposed to the outer periphery support part 38 of the bottom side support member 35. Also, the peripheral edge abutting part 44 and the outer periphery support part 38 support the thin wafer 4A in such a manner sandwich the thin wafer 4A therebetween (see FIG. 1).

The center abutting part 45 is a part for supporting the thin wafer 4A at its center. The center abutting part 45 is provided at the center of the disc 43 so as to face in a downward direction. Thus, the center abutting part 45 is opposed to the center support part 37 of the bottom side support member 35. Also, the center abutting part 45 and the center support part 37 support the thin wafer 4A in such a manner as to sandwich the thin wafer 4A therebetween (see FIG. 1).

The single thin plate storage container 1 such configured as described above is used in the following manner.

In storing the thin wafer 4A, the single thin plate storage container 1 is placed on a placement stand of a semiconductor wafer transfer apparatus (not shown), the hook 18 is released and the lid 3 is opened. At that time, the bottom side support member 35 is placed on the bottom plate 5 of the main body 2. When being placed on the bottom plate 5 of the main body 2, the bottom side support member 35 is accurately positioned and supported with its positioning projections 38B abutted with the seating portions 9A on the bottom plate 5. Additionally, the front side support member 36 is attached to the inside surface of the lid 3.

In this state, the vacuum tweezers of the transfer apparatus supports the thin wafer 4A and moves the thin wafer 4A directly to above the bottom plate 5. Then, the vacuum tweezers are brought down, and the thin wafer 4A is placed on the upper sides of the center support part 37 and outer periphery support part 38 of the bottom side support member 35. In this state, a wider space 41 than the vacuum tweezers is provided between the thin wafer 4A and the bottom side support member 35, and the vacuum tweezers are laterally pulled out without contact with the thin wafer 4A, in cooperation with the bottom plate 5 raised higher than the peripheral wall 6. Then, the lid 3 is closed and the hook 18 is fastened.

At that time, in the single thin plate storage container 1, the front side support member 36 on the inside surface of the lid 3 covers the upper side surface of the thin wafer 4A, and the peripheral edge abutting part 44 and the center abutting part 45 of the front side support member 36 abut the upper side surface of the thin wafer 4A.

The outer periphery support part 38 of the bottom side support member 35 is located on a lower side of abutting portion of the peripheral edge abutting part 44, and the peripheral edge abutting part 44 and the outer periphery support part 38 support the thin wafer 4A in such a manner to sandwich the thin wafer 4A therebetween from both the upper and lower sides. The center support part 37 of the bottom side support member 35 is located on a lower side of the abutting portion of the center abutting part 45, the center abutting part 45 and the center support part 37 support the thin wafer 4A in such a manner to sandwich the thin wafer 4A therebetween from both the upper and lower sides. Moreover, the peripheral edge abutting part 44 and the center abutting part 45 are elastically supported by the disc 43, the center support part 37 and the outer periphery support part 38 are elastically supported by the retainer 24, and the peripheral edge of the thin wafer 4A is elastically supported by the retainer 24 of the lid 3. The thin wafer 4A is thus elastically supported in a state of being floated with respect to the main body 2 and the lid 3, in a moderate manner without application of excessive forces.

At that time, the inside of the single thin plate storage container 1 is sealed by the seal material 13. In some cases, without providing the seal material 13, the single thin plate storage container 1 may be sealed by winding tape around the flush joined portions of the main body 2 and the lid 3 that are closed with each other.

In this state, the flange 31 is combined with the arm of the transfer apparatus, and the single thin plate storage container 1 is lifted and transferred.

To remove the thin wafer 4A from the single thin plate storage container 1, the hook 18 is released and the lid 3 is opened. Then, the vacuum tweezers are inserted into the space 41 from the side of the main body 2, and are raised in a state of being located below the thin wafer 4A, thereby lifting and moving the thin wafer 4A.

For cleaning the single thin plate storage container 1, the hook 18 is released from both the main body 2 and the lid 3, and the hinge 17 is extracted from the main body 2 and the lid 3. Additionally, the retainer 24, the bottom side support member 35, the front side support member 36 and the seal material 13 are taken out as well.

Next, these components are separately cleaned and dried. After that, the hinge 17 and the hook 18, etc. are attached.

As described above, the single thin plate storage container 1 has the following advantages.

(1) The single thin plate storage container 1 includes the bottom side support member 35 that is located on the main body 2 side and supports the thin wafer 4A by surface from the bottom side, and a front side support member 36 that is located on the lid 3 side and supports the thin wafer 4A from the upper front side, which makes it possible to support the extremely thin wafer 4A with safety and reliability in such a manner to sandwich it between the two members from upper and lower sides.

(2) The bottom side support member 35 includes the center support part 37 supporting the center of the thin wafer 4A by a surface from the bottom side, the outer periphery support part 38 supporting the outer periphery of the thin wafer 4A by surface from the bottom side, the peripheral edge support part 39 abutting the peripheral edge of the thin wafer 4A and supporting the thin wafer 4A radially from outside, and the ring plate 40 combining integrally the center support part 37 and the outer periphery support part 38. This makes it possible to support the thin wafer 4A with safety and reliability at its center, outer periphery and peripheral edge by the center support part 37, the outer periphery support part 38 and the peripheral edge support part 39. This also makes it possible to provide the space 41 under the thin wafer 4A for putting in and taking out a support means for the thin wafer 4A such as vacuum tweezers.

(3) The front side support member 36 includes the abutting parts 44, 45 that abut elastically the surface of the thin wafer 4A placed on the bottom side support member 35 and support the thin wafer 4A in such a manner as to sandwich the thin wafer 4A therebetween from the upper and lower sides by the bottom side support member 35. This makes it possible to elastically support the extremely thin, easy-to-bend wafer 4A in a safe and reliable manner.

In addition to the above mentioned abutting parts 44, 45, the front side support member 36 includes the disc 43 as an elastic support part provided on the lid 3 side and elastically supporting the abutting parts 44, 45. Consequently, the disc 43 elastically supports the abutting parts 44, 45 that abut the thin wafer 4A, whereby the extremely thin, easy-to-bend wafer 4A can be supported with reliability.

(4) Furthermore, the abutting part is composed of the peripheral edge abutting part 44 that is provided as opposed to the outer periphery support part 38 of the bottom side support member 35 and supports the thin wafer 4A in such a manner to sandwich the thin wafer 4A between the peripheral edge abutting part 44 and the outer periphery support part 38, and the center abutting part 45 that is provided as opposed to the center support part 37 of the above mentioned bottom side support member 35 and supports the thin wafer 4A in such a manner as to sandwich the thin wafer 4A between the center abutting part 45 and the center support part 37. This makes is possible to support the extremely thin wafer 4A reliably at its peripheral edge and center.

(5) The single thin plate storage container 1 includes the retainer 24 that is provided on the backside of the bottom side support member 35 and supports elastically the bottom side support member 35 placed on the bottom plate 5 of the main body 2. Accordingly, the retainer 24 elastically supports the bottom side support member 35 in a direct manner and supports the thin wafer 4A placed on the bottom side support member 35 in an indirect manner.

(6) The disc 43 of the front side support member 36 is fastened at its center to the inner side surface of the lid 3 and has its outer periphery as a free end capable of being elastically bent, thereby elastically supporting the peripheral edge abutting part 44 and the center abutting part 45, whereby the thin wafer 4A can be elastically supported. With this, the thin wafer 4A is elastically supported from the lower side by the bottom side support member 35, and is elastically supported from the upper side by the front side support member 36. Accordingly, the thin wafer 4A can be reliably supported in a state of being sandwiched from the upper and lower side between these support members and being elastically floated with respect to the main body 2 and the lid 3.

As a consequence, it is possible to support the large-diameter thin wafer 4A in a safe and reliable manner.

(7) In the bottom side support member 35, the center support part 37 is formed in the shape of a circle, the outer periphery support member 38 is formed in the shape of a fragmentary circular ring, and the peripheral edge support part 39 is formed in the shape of a fragmentary circular ring. This makes it possible to support the thin wafer 4A at its center on the lower side, its outer periphery and its peripheral edge. The large-diameter thin wafer 4A can be thus supported in a safe and reliable manner.

(8) The main body 2 includes the engagement piece 9 (seating portion 9A) that abuts the bottom side support member 35 for preventing side slip and turning of the bottom side support member 35. The bottom side support member 35 includes a positioning projection 38B that abuts the engagement piece 9 (seating portion 9A) of the main body 2 for preventing side slip and turning of the bottom side support member 35. Therefore, just by placing the bottom side support member 35 on the main body 2, the bottom side support member 35 is positioned and supported, and the positioning projections 38B abut each engagement piece 9 (seating portion 9A), which makes it possible to prevent the bottom side support member 35 from slipping sideways and turning.

(9) The bottom plate 5 of the main body 2 is raised up to a higher position than the peripheral wall 6, which makes it possible to insert the support means for the thin wafer 4A such as vacuum tweezers into the lower side of the thin wafer 4A in a lateral direction from the main body 2, in cooperation with the space 41 in the bottom side support member 35. Accordingly, the thin wafer 4A can be easily put into and taken out from the single thin plate storage container 1.

(10) A plurality of peripheral edge support parts 39 are arranged on a slightly larger circumference than the outer diameter of the thin wafer 4A placed on the bottom side support member 35. Thus, when the thin wafer 4A is placed in alignment with the center of the main body 2, the thin wafer 4A and the engagement pieces 9 do not contact with each other. When the thin wafer 4A moves, the engagement pieces 9 contact the peripheral edge of the thin wafer 4A for correction of the misalignment.

(11) The abutting surface of the peripheral edge support part 39 is bent around the peripheral edge of the thin wafer 4A. Consequently, even if the thin wafer 4A rapidly moves and comes into collision with the engagement piece 9, the abutting surface of the bending engagement piece 9 contacts widely with the peripheral edge of the thin wafer 4A and support the thin wafer 4A in a safe manner.

(12) A plurality of retainers 24 supporting the peripheral edge of the thin wafer 4A placed on the bottom side support member 35 are arranged on the inside surface of the lid 3. This makes it possible to support from the peripheral edge the thin wafer 4A placed on the bottom side support member 35 with the lid 3 put on the main body 2, thereby preventing the thin wafer 4A from slipping sideways.

(13) The retainer 24 is formed as an elastic body and the retainer fitting part to which the retainer 24 is attached is provided on the inside surface of the top plate 21 of the lid 3. Accordingly, the retainer 24 can be attached to the retainer fitting part in using the single thin plate storage container 1, and the retainer 24 can be removed from the retainer fitting part in cleaning the single thin plate storage container 1, resulting in an enhancement of cleaning efficiency.

(14) The retainer 24 is composed of the base 25 that is fitted into the retainer fitting part and the bending piece 26 that extends from the base 25 toward the thin wafer 4A, abuts the peripheral edge of the thin wafer 4A and presses elastically the thin wafer 4A in radially inward and downward directions. Accordingly, it is possible to press and support elastically and safely the thin wafer 4A placed on the bottom side support member 35 by the above mentioned bending piece 26 in radially inward and downward directions. Moreover, this allows the retainer 24 provided on the lower side of the bottom side support member 35 to support the bottom side support member 35 elastically with respect to the bottom plate 5 of the main body 2.

(15) The main body 2 and the lid 3 are combined with each other by the hinge 17 and are fastened to each other by the hook 18, which makes it easy to fasten the lid 3 to the main body 2 and also open the lid 3 from the main body 2.

(16) The seal material 13 is provided between the main body 2 and the lid 3, and the inside is sealed in an air-tight manner in a state where the main body 2 and the lid 3 are combined by the hinge 17 and fastened by the hook 18. Thus, just by putting the lid 3 and fastening the same to the main body 2 when the thin wafer 4A is stored inside, it is possible to hold the thin wafer 4A easily and reliably in an air-tight manner.

(17) The lid 3 combined with the main body 2 by the hinge 17 can be separated from the main body 2 at an open angle of 90 to 180 degrees. Thus, at the time of cleaning, the lid can be easily removed and cleaned, thereby increasing cleaning efficiency.

(18) The main body 2 and the lid 3 are formed in an almost same shape so that, when the lid 3 is closed, the main body 2 of the upper single thin plate storage container 1 can be fitted into the lid 3 and stacked in a plurality of layers. Therefore, it is possible to stack a plurality of single thin plate storage containers 1 in an easy and stable manner. In addition, since the main body 2 of the upper single thin plate storage container 1 is fitted and stacked in the lid 3 of the lower single thin plate storage container 1, the single thin plate storage containers 1 can be stacked in a compact manner without having a great height of stacking.

(19) The main body 2 and the lid 3 are formed in an almost same shape so that, when the main body 2 and the lid 3 are closed with each other, the joined portions of the main body 2 and lid 3 become flush with each other. Thus, winding tape around the joined portions makes it possible to seal the inside of the single thin plate storage container 1.

(20) The lid 3 is provided with the lid guide 23 as opposed to the main body 2. In putting the lid 3 on the main body 2, the lid guide 23 guides the lid 3 so that the lid 3 can be closed in a safe and accurate manner without causing a misalignment between the lid 3 and the main body 2. This allows the retainers 24 of the lid 3 side to abut the peripheral edge of the thin wafer 4A of the main body 2 side and support the thin wafer 4A with reliability.

(21) Either the main body 2 or the lid 3 or the both are made of a non-electrostatic polymeric material, which makes it possible to prevent the thin wafer 4A from being contaminated due to adhesion of dust, etc. Moreover, since at least the lid 3 is made of a transparent polymeric material, it is possible to see the inside of the single thin plate storage container 1 in which the thin wafer 4A is stored.

In addition, since both the bottom side support member 38 and the front side support member 36 are made of a non-electrostatic polymeric material, it is possible to prevent the thin wafer 4A from being contaminated because of dust adhesion, etc.

(22) Since the engagement flange 31 is provided on the peripheral edge of the lid 3 for the purpose of carrying, it is easy to transfer the single thin plate storage container 1 held at the engagement flange 31 by the arm of the transfer apparatus at the time of transferring.

(23) Since either the bottom plate 5 of the main body 2 or the top plate 21 of the lid 3 or the both are thicker in wall thickness at center than peripheral edge, it is not necessary to provide the reinforcement rib, thereby eliminating uneven portions therefrom. As a result, the main body 2 and the lid 3 can be easily cleaned and drained, which bring about an enhancement in cleaning efficiency.

MODIFIED EXAMPLE

In the above described embodiments, the single thin plate storage container for storing a normal-thickness wafer is used as it is, and its bottom side support member 35 is placed on the top plate 5 of the main body 2. Alternatively, the bottom side support member 35 may be fastened to or integrally attached to the bottom plate 5 of the main body 2. In addition, the front side support member 36 may be detachably attached to or fastened to the backside of the lid 3. In consideration of cleaning, it is preferable that the front side support member 36 is detachably attached to the backside of the lid 3. However, if there is no need for giving consideration to cleaning, the front side support member 36 may be fastened to the lid 3.

In the above mentioned embodiments, the two abutting parts, the peripheral edge abutting part 44 and the center abutting part 45, are provided to the disc 43 of the shock-absorbing support member 34. Alternatively, one, three or more abutting parts may be provided. In this case, the center support part 37 and outer periphery support part 38 of the bottom side support member 35 are located in the positions opposed to the abutting parts.

In addition, the peripheral edge abutting part 44 and the center abutting part 45 are formed in the shape of a circular ring. Alternatively, they may be in the shape of a fragmentary circular ring or in another shape. Moreover, the peripheral edge abutting part 44 and the center abutting part 45 have line contact with the wafer. Alternatively, they may have point contact or surface contact with the wafer. These parts may be arranged in any manner to support the thin wafer 4A from the upper side surface with safe and reliability. In this case, it is preferable to arrange these parts so as to support the thin wafer 4A in a uniform or approximately uniform fashion. At that time, the center support part 37, etc. of the bottom side support member 35 is formed in accordance with the abutting parts.

In these cases, it is possible to provide the same effects and advantages as the above mentioned embodiments do.

Furthermore, in the above mentioned embodiments, the center support part 37 of the bottom side support member 35 is formed of a circle, the outer periphery support part 38 is formed of a fragmentary circular ring, and the peripheral edge support part 39 is formed of a fragmentary circular ring. Alternatively, these parts may be of a circular ring or a fragmentary circular ring, provided that the thin wafer 4A can be supported in an overall uniform manner. They may be of another shape such as spaced projections. They must be formed with consideration given to the shape of the front side support member 36.

In this case as well, it is possible to provide the same effects and advantages as the above mentioned embodiments.

In the above mentioned embodiments, the disc 43 is provided as an elastic support part for supporting elastically the peripheral edge abutting part 44 and the center abutting part 45. However, the elastic support part is not limited to a disc. Any structure may be employed as long as the peripheral edge abutting part 44 and the center abutting part 45 can be supported elastically, and must be formed in accordance with the peripheral edge abutting part 44 and the center abutting part 45. In the case of forming the peripheral edge abutting part 44 and the center abutting part 45 as projections that have point contact with the wafer, for example, a large number of rod-shaped members for supporting the projections are arranged in a point-symmetrical and radial manner.

In the above mentioned embodiments, both the bottom side support member 38 and the front side support member 36 are made of a non-electrostatic polymeric material. Alternatively, only either of them may be made of a non-electrostatic polymeric material. Any structure may be employed as long as dust is adhered and contamination of the thin wafer 4A can be prevented.

What is claimed is:

1. A single thin plate storage container comprising a main body for storing one ultra-thin plate having a thickness of 25 μm to 400 μm that can be easily bent and a lid attached to the main body, wherein the single thin plate storage container comprises a bottom side support member that is located on the main body side and supports the thin plate by a surface from the bottom side, and a front side support member that is located on the lid side and supports the thin plate from the upper front side, and wherein the bottom side support member comprises a center support part for supporting a central part of the thin plate by the surface from the bottom side, an outer periphery support section for supporting an outer periphery of the thin plate by the surface from the bottom side, a peripheral edge support member for abutting a peripheral edge of the thin plate and supporting the thin plate radially from outside, and a ring board for combining integrally the center support part and the outer periphery support part, and wherein the front side support member comprises an abutting part that abuts elastically a front side of the thin plate placed on the bottom side support member and supports the thin plate in such a manner as to sandwich the thin plate between the abutting part and the bottom side support member, and wherein the abutting part is composed of a peripheral edge abutting part provided as opposed to the outer periphery support part of the bottom side support member and supports the thin plate in such a manner to sandwich the thin plate between the peripheral edge abutting part and the outer periphery support section, and an center abutting part that is provided as opposed to the center support part of the bottom side support member and supports the thin plate in such a manner as to sandwich the thin plate between the center abutting part and the center support part, and wherein when the lid is closed, the bottom side support member abuts and supports the thin plate from the bottom side and the front side support member abuts and supports the thin plate from the upper front side.

2. The single thin plate storage container according to claim 1, wherein the center support part of the bottom side support member is formed in the shape of a circle, the outer periphery support member is formed in the shape of a circular ring or fragmentary circular ring, and the peripheral edge support part is formed in the shape of a circular ring or fragmentary circular ring.

* * * * *

UNITED STATES PATENT AND TRADEMARK OFFICE
CERTIFICATE OF CORRECTION

| | | |
|---|---|---|
| PATENT NO. | : 7,624,870 B2 | Page 1 of 1 |
| APPLICATION NO. | : 11/431578 | |
| DATED | : December 1, 2009 | |
| INVENTOR(S) | : Nishizaka et al. | |

It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 574 days.

Signed and Sealed this

Twenty-first Day of December, 2010

David J. Kappos
*Director of the United States Patent and Trademark Office*